(12) United States Patent
Sul

(10) Patent No.: US 10,338,138 B2
(45) Date of Patent: Jul. 2, 2019

(54) LOW COST DESIGN FOR TEST ARCHITECTURE

(71) Applicant: Chinsong Sul, Santa Clara, CA (US)

(72) Inventor: Chinsong Sul, Santa Clara, CA (US)

(*) Notice: Subject to any disclaimer, the term of this patent is extended or adjusted under 35 U.S.C. 154(b) by 64 days.

(21) Appl. No.: 15/397,567

(22) Filed: Jan. 3, 2017

(65) Prior Publication Data

US 2017/0193154 A1 Jul. 6, 2017

Related U.S. Application Data

(60) Provisional application No. 62/274,168, filed on Dec. 31, 2015.

(51) Int. Cl.
*G01R 31/3183* (2006.01)
*G01R 31/317* (2006.01)

(52) U.S. Cl.
CPC ........... *G01R 31/318364* (2013.01); *G01R 31/318314* (2013.01); *G01R 31/31704* (2013.01)

(58) Field of Classification Search
CPC ........... G01R 31/318364; G01R 31/318314
USPC ........................................ 716/136
See application file for complete search history.

(56) References Cited

U.S. PATENT DOCUMENTS

| 6,456,961 B1* | 9/2002 | Patil | G01R 31/31850 703/14 |
| 6,678,645 B1* | 1/2004 | Rajsuman | G06F 17/5022 703/14 |
| 8,775,985 B2* | 7/2014 | Wang | G01R 31/31704 703/15 |
| 2002/0157082 A1* | 10/2002 | Shau | G01R 31/2856 716/50 |

* cited by examiner

*Primary Examiner* — Stacy Whitmore
(74) *Attorney, Agent, or Firm* — Pamela Lau Kee

(57) ABSTRACT

A Design-for-testability method based on composition of test patterns copes with increasing test complexity and cost metric of a large system. System-level structural test patterns from test patterns of constituent subsystems, cores and design IPs are constructed without requiring their design netlists. The delivered test patterns can be utilized 100% in the testing of system. The system-level test pattern is delivered to the device under test, the subsystem test patterns can be scheduled and applied continuously without being interleaved by test deliveries until all of the subsystem test patterns are exercised. Absence of design netlist requirement allows uniform integration of external and internal IPs regardless of availability of test isolation logic or design details. Concurrent test of constituents and their mutual independence in scan operations allows implicit distribution of test protocol signals such as scan enable (SE) and the scan clocks. The method enables at-speed testing of memory shadow logic.

12 Claims, 25 Drawing Sheets

Communication Constraint
C: $v = v'$

IODG*: Labelled IODG (a) Test process (b) Vacuous test process (a) Test schedule (b) Corresponding test process (a) Latest composition (b) Earliest Composition

LOW COST DESIGN FOR TEST ARCHITECTURE

CROSS-REFERENCE TO RELATED APPLICATION

This application claims the benefit of U.S. Provisional Application No. 62/274,168 filed Dec. 31, 2015.

FIELD OF THE INVENTION

The invention is directed towards large scale system integration, e.g. 3D integrated circuit (IC) integration, providing a system with increased functionality, superior performance, lower manufacturing cost and higher reliability. Persistent time-to-market pressure can influence a design paradigm that encourages a hierarchical or core-based design approach to mitigate design challenges and to tame design complexity. The scheme employs the 3D IC to indicate a large system for the purposed of discussion.

BACKGROUND

Modern integrated circuit systems are increasingly large and complex to satisfy insatiable demands of applications desired from every aspect of human life. Design of a large and complex system with increased time-to-market pressure, however, can pose new challenges in design paradigm and in taming of test cost and test development effort. Conventional design-for-test (DFT) methods and generation-based test development can offer a limited success in coping with new design paradigms and test challenges and in meeting aggressive time-to-market constraint.

Aim of a large scale system integration such as the 3D IC integration is to provide a system with increased functionality, superior performance, lower manufacturing cost and higher reliability. Persistent time-to-market pressure can influence a design paradigm that encourages a hierarchical or core-based design approach to mitigate design challenges and to tame design complexity. The scheme employs the 3D IC to indicate a large system for the purposed of discussion.

Modern 3D IC can be a mixed-signal device that contains both analog and digital components. While the testing of analog circuits can be typically managed by application specific functional tests or built-in self-test (BIST), the digital counterpart can be commonly tested by structural test methods. Generation of the structural test patterns is often automated but their development time and effort can depend on size and complexity of device under test (DUT). Management of test cost and test development in an aggressive time-to-market business environment can be a challenging task.

Test cost and test development effort can be important factors for successful commercialization of 3D IC devices due to increased test complexity with respect to size and heterogeneity of constituting components. Test cost can be measured by test time and test data volume. Test time of structural tests can be dominated by time to deliver test data to device under test (DUT). Reduction of test cost can be achieved by enabling test solutions that maximize utilization of delivered test data so that total size of test data delivered can be minimized for the testing of the DUT.

Test development cost, in terms of development time and effort, can be as important as test cost from the competitive time-to-market point of view. Test development cost can be adversely affected by the size and complexity of the DUT. The test complexity can require increased engineering effort for efficient utilization of the available tests. Capability of commercial EDA tools and their runtime, for example, can be limited by size of the DUT. Current EDA tools may not be able to process entire 3D IC designs for automatic test pattern generation (ATPG) and automatic design-for-testability (DFT) hardware insertion. Conventional test isolation methods can aid to partition system into a set of subsystems for the ATPG and test one partition at a time. They, however, unnecessarily isolate cores under test from their system environment that they interact with and can offer limited flexibility in achieving high test data utilization and at-speed test coverage of interface logic among interacting cores.

The desirable DFT methods for the 3D IC system can independently integrate implemented DFT of cores without isolation from their system environment and compose test patterns of corresponding cores to form test patterns of any level of design hierarchy without referring to their design netlists. Composition of test patterns can be far more advantages than generation of test patterns in terms of test development cost because composition of test patterns can be many orders of magnitude cheaper than generation in terms of computational effort.

Due to testability constraint measured by controllability and observability, structural tests can be primarily applied to the testing of digital circuits. The most commonly employed DFT method in structural tests can be based on scan design. In the scan design, internal registers can be configured into shift registers for test data delivery. The shift register is called a scan chain. There can be multiple scan chains. The scan chains can allow initialization of the internal registers for a given test prior to the test (controllability) and observation of the test response captured in the internal registers after the test for test decision (observability). Example of the scan-based design is shown in FIG. 1A. The scan enable (SE) can configure the internal registers into the scan chains. The SE can toggle between the scan shift mode for a test data delivery and the functional for a test response capture.

Most commonly applied structural tests are static and dynamic tests. Static tests can target detection of permanent defects that change circuit topology of the DUT. Similarly, dynamic tests can aim to detect delay defects that prevent devices from reaching their performance specifications. Examples of static and dynamic tests can be stuck-at test and at-speed transition test, respectively. The stuck-at test can target permanent defects by assuming their behavior as input or a output of logic gate in the DUT being stuck at logic one or zero. The transition test can target excessive delays caused by defects by modeling their behavior as slow transition in input or output port of a logic gate.

The scan-based design can increase test development efficiency by reducing a sequential depth during the ATPG. The sequential depth can be defined as a number of state transitions to reach a required state from a given initial state. The smaller the sequential depth, the more efficient ATPG from computational aspect. In case of the stuck-at test, for example, the scan-based DFT method can transform a sequential test problem into a combinational. The sequential depth of the combinational test can be zero.

Operation of the scan-based DFT method can be defined in a scan protocol. The scan protocol can be summarized as follows:

1. Load/unload scan chains
2. Force input
3. Measure output
4. Capture test response In the first step, the internal registers of the DUT can be configured into shift registers, if the SE=1. While the internal registers can be initialized by loading the test data into the shift register inputs, the shift register outputs can be measured for test decision. After completion of the scan load/unload, the internal registers can be configured back to the functional for testing, if the SE=0. The primary input of the DUT can be forced with the input stimulus to excite faults that model defects on the IO logic in the second step. In the third step, the primary output can be measured to observe faults on the IO logic. Finally, the test response of the DUT can be capture into the internal registers. The captured outputs can be observed while the scan chains are loaded. The The steps in the scan protocol can be repeated for each test pattern.

The test pattern can be generated by the ATPG according to the scan protocol, as shown below. The scan input (SI) and the scan output (SO) denote the expected content of the internal registers before and after the capture, respectively. The SI can be shifted into the DUT and the output of the DUT can be compared against the SO for test decision during the scan load/unload. The primary input (PI) and the primary output (PO) denote the input stimulus applied to the primary input of the DUT and the expected output measured at the primary output, respectively. The input of DUT can be forced with the PI and the output can be compared with the PO for detection of faults.

| Test Pat. No. | Internal Reg (pre- & post-test) | | Primary Input & Output | |
|---|---|---|---|---|
| TP # | SI | SO | PI | PO |

The DFT schemes and the ATPG methods can be coupled. The DFT architectural decision can affect capability and efficiency of the ATPG. Similarly, innovation in the ATPG technology can also influence the underlying DFT architectures.

The 3D IC system can comprise a set of interacting cores. The interacting cores can communicate via channels. Channel can have a source and a sink. Source can provide data to a channel and sink can consume the data from the channel. Communication can be achieved when the data provided by source is consumed by sink.

In digital circuits, a channel can be formed by a wire connecting output of one core (source) to input of other core (sink). The channel can be denoted with the name of the connecting wire. The same name of the output and the input can imply formation of a channel.

When communication is to be established, channel can create a communication constraint that requires input of sink to be the same as output of source. The communication constraint can be captured in a topology, e.g. an input-output dependency graph (IODG). Example of the IODG that represents the system comprising four interacting cores is shown in FIG. 1B. The IODG can consist of a set of vertices and edges. The vertices and the edges denote cores and channels, respectively. Source and sink are denoted with a tail and a head of an arrow in the IODG, respectively. The cores 0 through 3 can be interconnected to form a target system. The cores 0 and 3 can communicate to the system environment via the primary inputs and outputs. The primary IO can be a unidirectional or a bidirectional. All other cores are internal and do not directly communicate to the system environment. The system environment is explicitly shown in the IODG. The system environment can provide input to and receive output from the corresponding system. Thus, output and input of the system environment can be input and output of the system, respectively. The names of the PI and the PIO can be interpreted as the channels. Source and sink of the bidirectional channel can be determined by the output enable control.

Communication constraints can be imposed between the output of the source and the input of the sink. Satisfaction of the communication constrains can require information of both source and sink. Test development cost can depend on how information is presented in resolution of the communication constraints. In conventional ATPG approaches, design netlists of both source and sink are used to resolve their communication constraints. Communication constraints on pseudo-primary input and output can also be considered. The pseudo-primary input and output can be respectively output and input of internal storage cells or flip-flops (FFs) that comprise the scan chains. They, however, can be local or internal to each core, regardless of being source and sink, and can always be satisfied by the ATPG of each core.

For a core to be tested, the PI and the PO of the core are must be provided and measured, respectively. An environment that provides the PI to the core and measure the PO is defined as a test environment of the core. The test environment of an individual core can be generally provided by a set of cores and the system environment. Communication constraints can be considered as IO constraints to be satisfied between the core under test and the test environment with which the core interacts. Since the test environment can be unknown for the ATPG of an individual core performed independently, the communication constraints can also be unknown. Unavailability of communication constraints can prevent reuse of the core test patterns and can cause underutilization of test resources and inefficiency in both the ATPG and the system test.

Even if the test patterns are delivered to all cores, for example, only subset of the cores can be actually tested by the delivered test data. Inefficient use of test resources can be implied in the underutilized test data.

Without satisfying communication constraints, construction of the system-level test patterns from the independently generated core test patterns can be difficult, if not impossible. In other word, the ATPG is forced to be a generation-based and not a construction or composition-based.

Resolution of communication constraints can allow reuse of core test patterns, improve utilization and hence reduce both test cost and test development cost. It can also promote a modular approach in test logic insertion and the ATPG. The test logic insertion and the ATPG can be performed in each core independently without knowledge of its system environment. The test logic inserted cores can be composed through the common test integration platform that can allow uniform integration of independently implemented test logics. The ATPG of any levels of design hierarchy can be similarly performed to construct the test patterns from those of its lower level design constituents.

Scan Wrapper (IEEE STD 1500) can isolate each core under test from its system environment for the independent ATPG by inserting registers, called IO wrapper cells, in the channels connecting them. In the IEEE standard, the core under test can be tested in isolation without involvement of its system environment. The system environment of the core under test, called a parent, is blocked by a set of IO wrapper cells during the core test. Instead, the test environment of the core under test is forced through the IO wrapper cells. The inserted wrapper cells modify the channel behavior during the test. Each wrapper cell that block the channel for isolation can provide a test point during the test. The test point can be used to control input of the core or to observe the output. Underutilization of test resource, however, can be implied in the IEEE STD 1500. Mutually exclusive usage of the wrapper cells between core and its environment can imply that the core and the parent are not meant to be tested in the same test run. That is, the communication constraints for sequential execution of the core and the parent tests cannot be satisfied from their independently generated test patterns. It is also difficult to apply the core wrapper standard to dynamic test of the interface logic between the core and its parent.

SUMMARY

The present invention can satisfy any communication constraints and hence, can enable a composition-based ATPG. The corresponding DFT architectures can achieve 100% or high test pattern utilization by continuously executing core tests one after another without being constrained by communication constraints in each stage of the system test. The test patterns of any higher-level of design hierarchy can be constructed or calculated from lower-level test patterns without requiring design netlists of the lower levels. The ATPG can require the channel information or the interconnection information. The channel information can be provided by the IODG with its edges labelled by the channel name and its size, or a channel_name[N-1:0].

The method provides a modular test platform for testing large systems. The test platform can comprise test distribution network and test sequencer. The test distribution network can be responsible for test data delivery and the test sequencer can administer execution of core tests to achieve maximum test data utilization. Test patterns of each core can be independently generated in parallel and used to calculate the targeted system level test patterns. Cores, hard external IPs, and any subsystems can be plugged into the test distribution network to form a system level DFT architecture. Since the scheme can be uniformly applied to a different form of subsystems including cores, IPs and levels of design hierarchy, the core is used to represent all applicable subsystems in discussion of the method. The DFT architecture can manage inclusion and exclusion of cores. Presence of all cores is not mandatory in the DFT scheme. Some cores can be absent and can be plugged in later when they are available.

A compositional approach to ATPG is attempted in the scheme. In the compositional approach, test patterns of any level of design hierarchy can be obtained from composition of lower-level test patterns. Composition of the test patterns can be based on calculation of test patterns without involvement of the design netlists, as discussed earlier.

The scheme focuses on what can be computed from a given set of test patterns and provide the corresponding DFT architectures to maximize what can be computed.

The composition can preserve test coverage of cores so that fault simulation after the composition may be unnecessary.

In the DFT scheme, the test distribution network can be considered as a token-based distributed system. The test data to be delivered can be tagged with a token to indicate a validity of input test data. The valid test data can be consumed only once. The cores plugged in the test distributed network can receive the valid test data addressed to them. The test protocol of the network ensures the correct test delivery to each core. The state of token is used to derive local states for end of test delivery and beginning of the test execution. The derived local states can also be employed to reduce power during the test delivery and to provide local test control signals require by the scan test protocol discussed earlier.

The DFT architectures provide flexible test data delivery schemes and high test pattern utilization at low power.

The scan enable (SE) and the scan shift clock can be derived locally for each core. No global SE and scan clocks can necessary.

BRIEF DESCRIPTION OF THE DRAWINGS

FIG. 1A is an example of the scan-based design. FIG. 1B is an example of the IODG that represents the system comprising four interacting cores.

DETAILED DESCRIPTION

Compositional ATPG

Figure 1A:
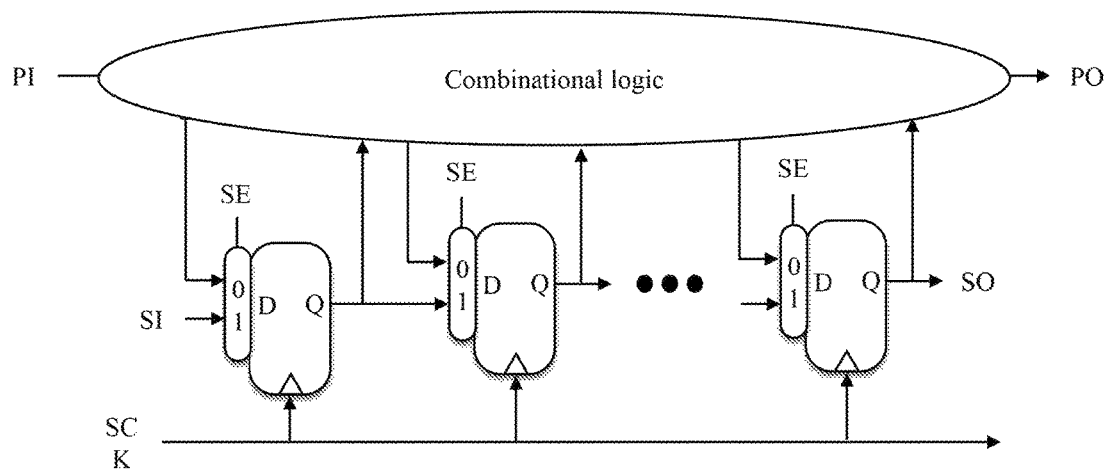
FIGS. 1A and 1B illustrate prior art examples of scan-based design.
Figure 1B:
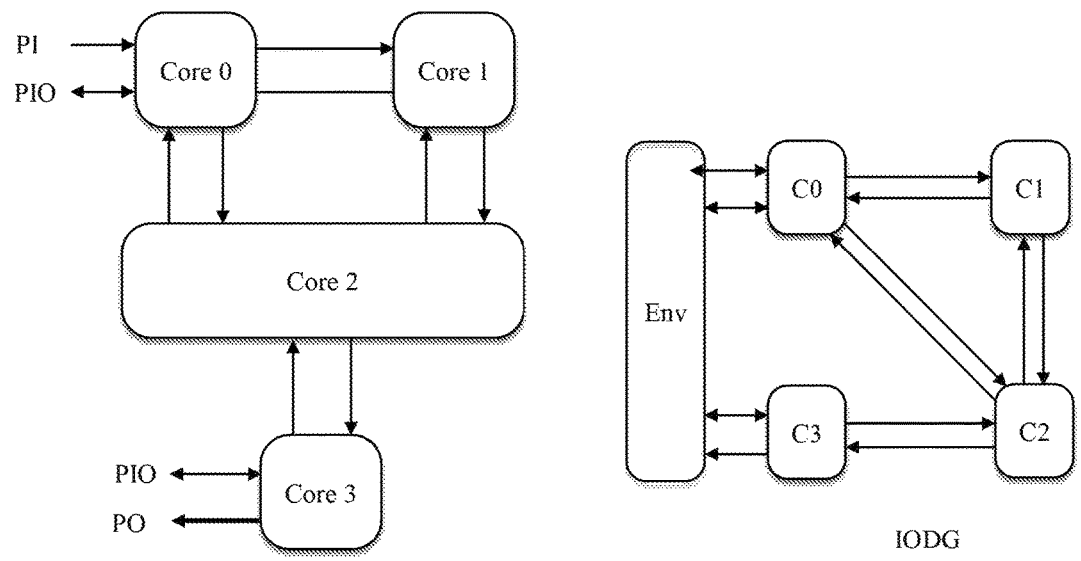
Figure 2A:
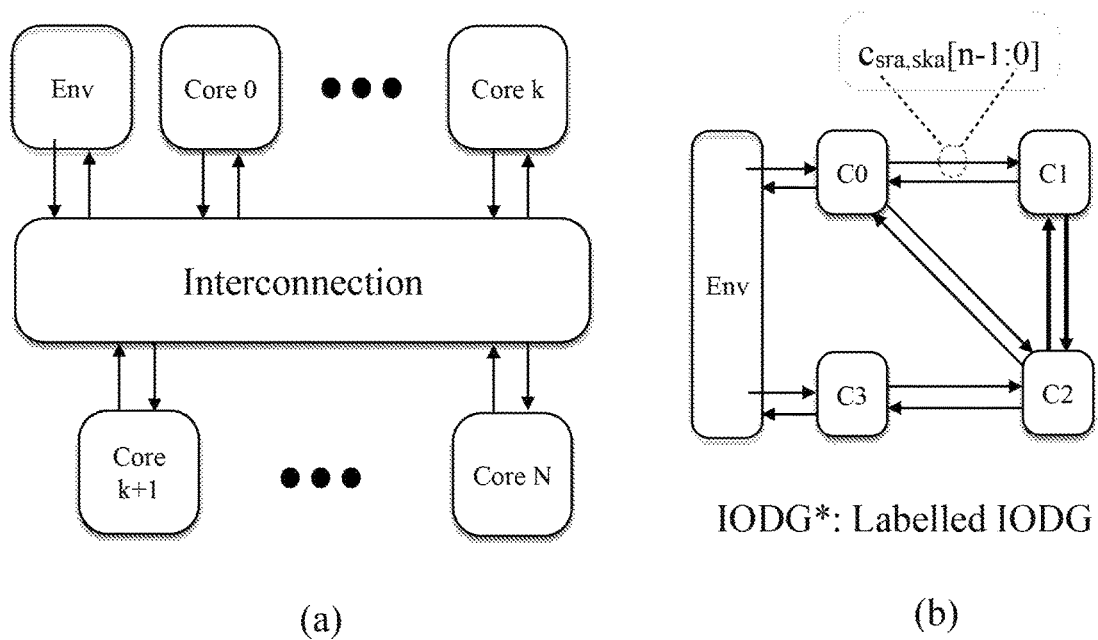
FIG. 2A is a prior art example of 3D IC systems having design components or cores.

Generation of system test patterns from its design netlist is costly with respect to time and computational effort. Instead of adapting generation approach based on design netlists as in the prior art, a compositional approach is based on test patterns of constituent subsystems or design cores. The test patterns represent design under consideration for context of targeted tests. The test patterns of each constituents can be generated independently without assumption of others. To compose test patterns of constituents, any IO conflict between constituents must be resolved in their test patterns. Resolution of IO conflicts can be specified in communication constraints. The communication constraints can be obtained from order of test execution of constituents, called test schedule, and their IO connections that can be represented by a IO directed graph (IODG) (FIG. 2.5). In an embodiment, a translation layer is introduced to satisfy the communication constraints. The translation layer can translate output of source constituent to match expected input of sink constituent so that the communication constraints between them can always be satisfied. Composition of test patterns can be amounted to calculation of translations, called translation vectors, for a given a set of test patterns of constituents and their test schedule.

A Translation Layer (TL) is positioned between the constituents to resolve communication constraints. The TL is incorporated into the channels that connect the constituents. The TL satisfies communication constraints involving static logic values and signal transitions and, hence, can be applied to composition of both static and dynamic test patterns. Resolution of communication constraints can allow construction of the system test patterns from composition of test patterns of its constituents without consulting to their design netlists. Compositional approach can imply unified integration of hard and soft IP subsystems or design cores for test because they can be represented by their test patterns in the scheme.

The aforementioned architectures provides a test schedule and sequence that resolves communication constraints and thereby allows uninterrupted continuous execution of tests for increased test pattern utilization. The test of any set of constituents can be continuously executed in the system test until all test data delivered to them are exercised for the test. Continuous executable system test patterns can be constructed by composition according to a test schedule. The test schedule can be considered as concurrent processes of which their behavior can be specified by a set of allowed test execution sequences of constituents, subsystems or cores. Synchronization among constituents in execution of the test schedule can be denoted by their communication constraints. If, for example, the constituents A and B are not connected in the system, they can execute tests in parallel because no communication constraints may exist between them. Otherwise, the constituent A may execute the test before the B does or vice versa. Any order of execution is allowed in the scheme. The order can depend on whether the test patterns before or after test execution are to be translated.

In a large system design environment, the ATPG of constituents or partitions of the system can be run in parallel on multiple processors to reduce test development time. The generated test patterns of each constituent can be a unit of test patterns used to compose the system test patterns. The test patterns of each constituent can be communicated to other partitions to meet communication constraints for composition of system test patterns. Since the ATPG of each constituents can be carried out in isolation and only test patterns are communicated once after generation for composition of test patterns, the scheme can offer superior means to utilize available parallelism to expedite test development than the conventional approaches that could not resolve communication constraints of constituents.

Purpose of at-speed inter-core test is to detect delay defects in the IO interface logic of core. Detection of an excessive delay can involve propagation of transitions. The required transition can be launched from the source and captured at the sink. The delay defect can be detected by checking whether sink core can capture the transition within the specified timing window. Thus, the launched transition can be translated to satisfy the communication constraints at the sink for capture. If the test patterns of source can provide a single transition at each input of sink, the test patterns of source can be used as a transition generator to test all delays in the interface logic between them. Since the inter-core test can involve more than one core, the test patterns of all participating cores must have the same length or the same number of test patterns. Their length can be equalized by duplication of shorter test patterns or incremental ATPG based on received test patterns of neighboring constituents in order to preserve original test coverage of the constituents.

Aim of the compositional ATPG approach is to construct test patterns of a higher-level of design hierarchy from the test patterns of constituents or cores without referring to their design netlists. The efficiency of test patterns can be measured by a test pattern utilization, denoted as U. The utilization can be defined as $$U = N_{avg} \div N_{total} \qquad \text{Eq. 1}$$

where the $N_{avg}$ and $N_{total}$ denote average number of cores tested in the test patterns of system and total number of core in the DUT, respectively. Goal of the compositional ATPG can be construction of the test patterns that can achieve 100% utilization.

A glue logic of the higher-level of design hierarchy can also be considered as a core.

Figure 5:
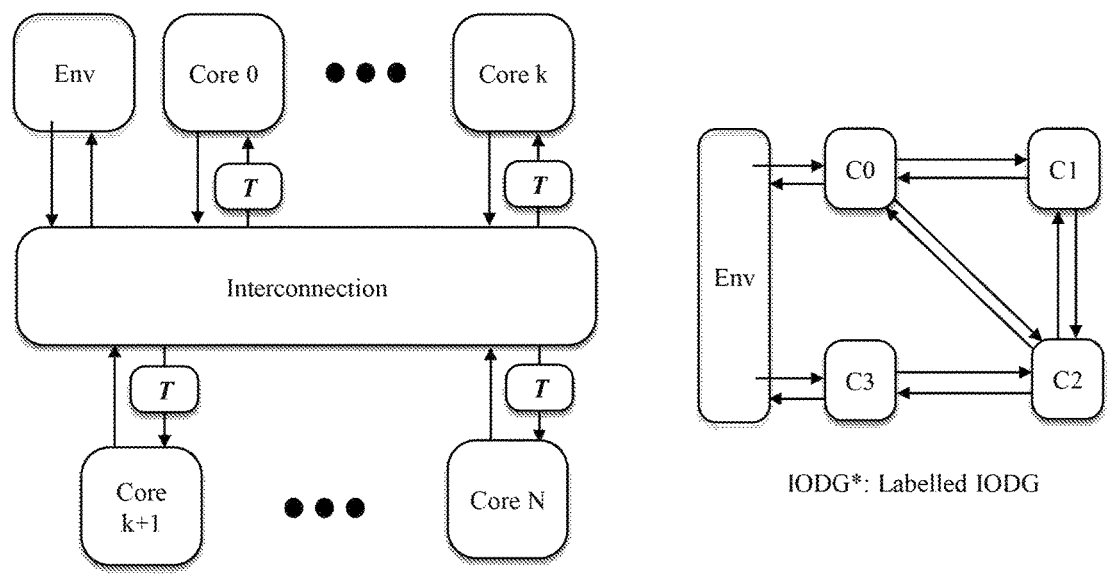
FIG. 5 is an embodiment illustrating the Topological View that includes a translation layer.

The 3D IC systems can comprise design components or cores as shown in FIG. 5. In the scheme, the core can be considered a unit of circuit under test from which the test patterns can be generated for composition. The x-th core can be denoted by Core x. in the diagram and the Cx in the IODG. The core index x can be considered an address of the x-th core. The Core 0, for example, can be considered a top-level glue logic which can integrate other cores to form a system. The core can be combinational logic. A set of all cores in system under test, denoted as SYS, can be expressed as $$\text{cores(SYS)} = \{\text{Core } x | 0 \leq x \leq \text{core\_count(SYS)}\} \qquad \text{Eq. 2}$$

where the function cores(SYS) returns a set of all cores in SYS and core_count(SYS) number of cores SYS.

The cores can be connected through interconnections. The interconnection from output of one core to input of another core can form a channel. The core which can provide the input to the channel is called source and which can receive the input from the channel sink. Output of the x-th source core is denoted by x.out and input of the y-th sink core by y.in. The channel formed between the x.out and the y.in can be denoted by a channel relation $c_{x,y}$ that relates x.out and y.in. Channels formed in system under test can be specified by a labelled IODG. The labelled IODG, or simply the IODG, can be denoted as (V, E×L), where the V, E and L denote a set of vertices, edges and labels, respectively. The edge and the label in the E and L can represent the channel labelled with its name and data width or size. For a n-bit channel c∈E from the source to the sink, the channel can be labelled with the $c_{x,y}[n-1:0] \in L$ or simply $c_{x,y} \in L$. The IODG can capture the communication constraints of the interacting cores.

The channel of size n from the Core x to Core y can be defined as $$c_{x,y}[n-1:0]=\{(c_{x,y}[i]|0 \le i \le n-1\}, \text{ where } c_{x,y}[i]=(x.\text{out}[i],y.\text{in}[i]) \qquad \text{Eq. 3}$$

The input and the output functions of the channel $c_{x,y}$, denoted as input($c_{x,y}$) and output($c_{x,y}$) can be defined as $$\text{input}(c_{x,y})=\{x.\text{out}[i]|(x.\text{out}[i],y.\text{in}[i]) \in c_{x,y}[i], 0 \le i \le n-1\} \qquad \text{Eq. 1}$$

$$\text{output}(c_{x,y})=\{y.\text{in}[i]|(x.\text{out}[i],y.\text{in}[i]) \in c_{x,y}[i], 0 \le i \le n-1\} \qquad \text{Eq. 2}$$

The x.out and the y.in are output and input of Core x and y, respectively.

A set of channels of which arbitrary Core y e V can interact, denoted as channels(Core y), can comprise a set of input channels and output channels, denoted as in_channels (Core y) and out_channels(Core y), respectively. The channels(Core y) can be defined as $$\text{channels(Core } y) = \text{in\_channels(Core } y) \cup \text{out\_channels(Core } y) \qquad \text{Eq. 3}$$

$$\text{in\_channels(Core } y) = \{c_{x,y}|c_{x,y} \in E \times L, \text{Core } x \in V\} \qquad \text{Eq. 4}$$

$$\text{out\_channels(Core } y) = \{c_{y,z}|c_{y,z} \in E \times L, \text{Core } z \in V\} \qquad \text{Eq. 5}$$

Figure 2B:
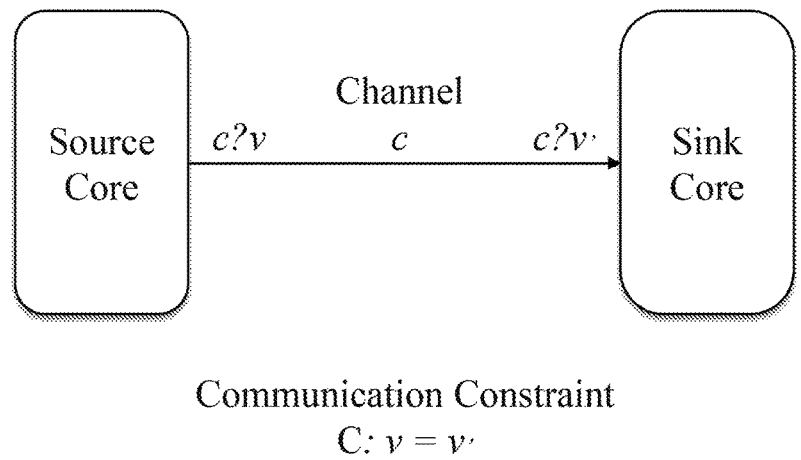
FIG. 2B is a prior art example of the Communication Constraint between the design components.

Example of the channels of the core is summarized in the Table 1 below for Core 0 and 2 from the labelled IODG shown in FIG. 2B.

TABLE 1

| Channels | Core$_0$ | Core$_2$ |
|---|---|---|
| channels (Core y) | {$c_{0,1}$, $c_{0,2}$, $c_{1,0}$, $c_{2,0}$, PI$_0$, PO$_0$} | {$c_{2,0}$, $c_{2,1}$, $c_{2,3}$, $c_{0,2}$, $c_{1,2}$, $c_{3,2}$} |
| in_channels (Core y) | {$c_{1,0}$, $c_{2,0}$, PI$_0$} | {$c_{0,2}$, $c_{1,2}$, $c_{3,2}$} |
| out_channels (Core y) | {$c_{0,1}$, $c_{0,2}$, PO$_0$} | {$c_{2,0}$, $c_{2,1}$, $c_{2,3}$} |

A projection of channels(Core y) onto channels(Core x), or channels(Core y)↑channels(Core x), can be defined as $$\text{channels(Core } y) \uparrow \text{channels(Core } x) = \text{channels(Core}_y) \cap \text{channels(Core } x) \qquad \text{Eq. 6}$$

The projection can be applied to find the established channels between the cores. To identify each communication constraint from source to sink, the sink input channels can be projected onto source output channels, or in_channels (sink)↑out_channels(source).

Example of Projection
  channels(Core 2)↑channels(Core 0)={$c_{2,0}$, $c_{0,2}$}
  channels(Core 2)↑out_channels(Core 0)={$c_{0,2}$}
  in_channels(Core 2)↑out_channels(Core 0)={$c_{0,2}$}

A communication can be an event that is described by a pair c.v where c is the name of the channel on which the communication takes place and v is the value of the message which passes. If the channel c is a single bit, for example, communication can be either c.0 or c.1. The communication can also be extend to include don't-care value denoted as c.X. Functions can be defined to extract channel an message components of a communication channel(c.v)=c, message(c.v)=v Communication c.v can occur whenever the source outputs a value v on the channel c and the sink inputs the same value.

Each pair of connected nodes in the labelled IODG can indicate channel between them. Events of which source outputs a value v on the channel c and sink inputs the value v' on the same channel are denoted by c!v and c?v', respectively. The source can output the value v on the channel c after the test data delivery or the test execution. The sink can input the value v' when its test is started. Communication can occur when the sink inputs the value v' from the same channel during the test. When communication occurs, it can imply that channel(c.v)=channel(c.v') and message(c.v) =message(c.v'). Thus, as shown in FIG. 2B, the communication constraint C can be specified as $$C: c.v \Rightarrow (\text{message}(c.v) = \text{message}(c.v')) \text{ or } c.v \Rightarrow (v=v') \qquad \text{Eq. 10}$$

Since the communication constraint is defined by synchronization of message over the channel, it can be known or visible to the core under test, or simply the core, if all of its sources and sinks are available. A set of all sources and sinks for each core under test can form a test environment. Without information on the test environment, the core cannot foresee its communication constraints. Consequently, test patterns of the core that are generated independently without knowledge of its environment can be generally difficult to satisfy the communication constraints. Unsatisfied communication constraints can be one of main sources of inefficiency in conventional DFT and ATPG approaches. Conventional approaches can often attempt to disable the communication constraints by isolating the core for test or to satisfy them by including design netlist of its test environment. Conventional test isolation methods can prevent cores from being tested continuously and often lead to underutilization of test data and loss of at-speed test coverage, as discussed earlier. Incorporation of design netlist of the test environment to satisfy communication constraints can increase test development time and cost and hence affect time-to market. Adoption of sequential approach for test pattern generation to cope with underutilization can also lead to unmanageable test development effort.

Figure 3A:
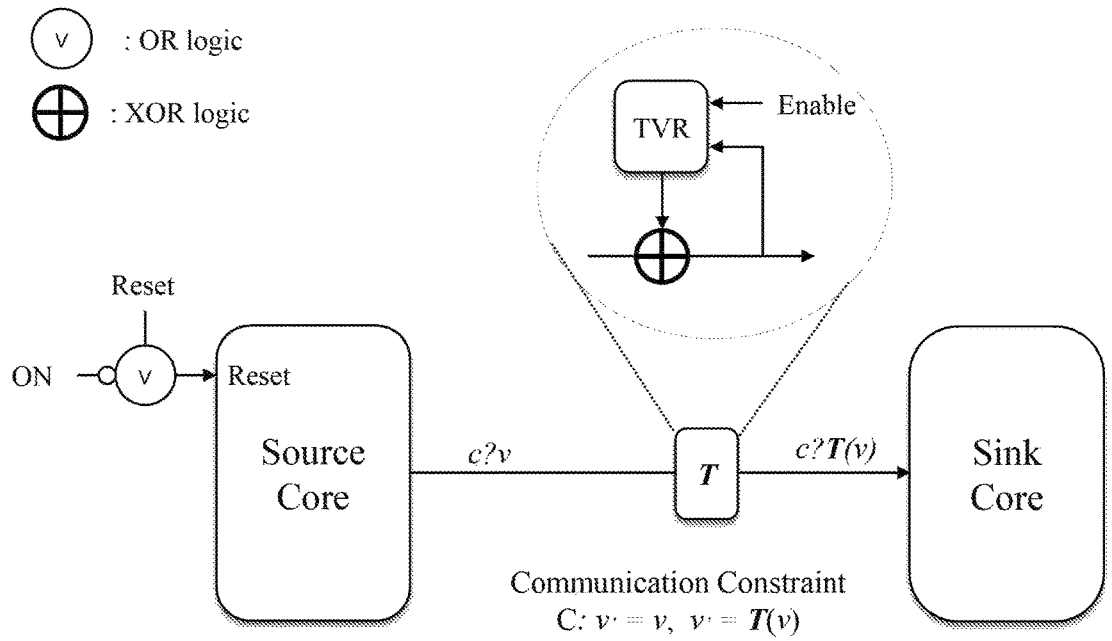
FIG. 3A is an illustrative embodiment of a 3D IC system including a translation layer.
Figure 3B:
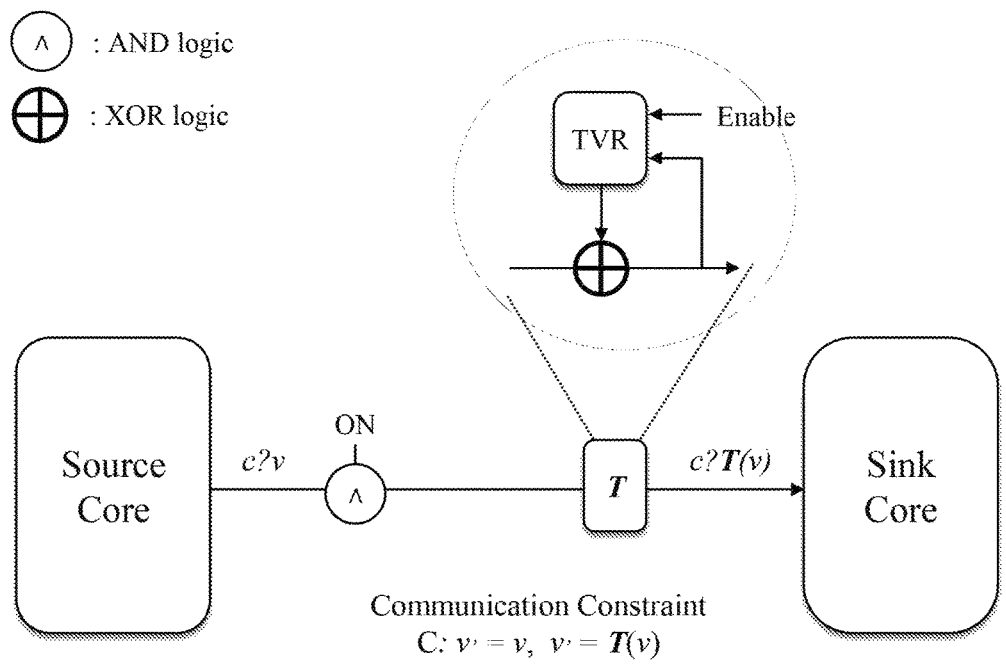
FIG. 3B illustrates another embodiment of a 3D IC system including a translation layer.

In order to satisfy any communication constraint, output of source can be transformed or translated prior to input of sink. That is, for the source output c!v and the sink input c?v', the v'=T(v), as shown in FIGS. 3A and 3B. The transformation T is called a translation layer (TL) and can be determined as follows.

Property 1
  v'=T(x), where T(x)=g(x)⊕x, and g(x)=v'⊕x and x=v
Proof
  v'={Since identity of ⊕ is 0, where ⊕ denotes exclusive-OR (XOR)}
  v'⊕0={0=v⊕v}
  v⊕(v⊕v)={Associativity of ⊕}
  (v'⊕v)⊕v={let x=v}
  T(x)={let g(x)=v'⊕x}
  g(x)⊕x
(End of Property and Proof)

The g(x) is called a translation vector of arbitrary input x. The g(x) can satisfy any communication constraint of x in the T(x). The T(x) can map the output of source to the g(x)

which maps the same output to the input of sink. The translation vector can be calculated from the test patterns of interconnected cores and provided in the register as shown in FIG. 3A. The register is called a translation vector register (TVR) and can be initialized in the test delivery.

The TL can non-intrusively isolate each core for silicon debug. The TL can provide input to the core based on the output of source and observe output through a set of translation layers of sinks to which it provides inputs. Furthermore, if output of source can be forced to a logical constant 0 or 1, input of core under test can be directly provided from the TL. Application of the TL in generation and verification of test patterns for system-level test can be beneficial, especially when source is not yet available or complete. Constant input of the TL, for example, can be provided from black box model of source when source is unavailable and can be replaced with its reset state later. Replacement can results in recalculation of translation vectors only. The test patterns are unaffected. Outputs of source can be fixed to determined logical values by turning off the core test with a control input ON=0, as shown in FIG. 3A. Note that Reset is assumed to be a system reset and ON a local on-off test control input confined to core under test only. XOR in the TL can function as a buffer or an inverter if input of the TL is logic 0 or 1, respectively. Thus, the input of core under test can be provided by loading the translation vector registers with the required input or its logical negation depending on the reset value.

Alternatively, if reset were unavailable, constant input of the TL can be calculated from the previously delivered test pattern or provided by suppressing output of source or input of the TL, as shown in FIG. 3B. The input of the TL, for instance, can be tied to logic 0, if ON=0. Otherwise, output of source is enabled in the TL.

With an aid of ON test control signal, a set of all translation layers employed in system under test can provide test access for silicon debug. ON can allow input of core to be determined solely by the TL. Output of core also be captured into the translation layers of its sinks.

The TL can also aid to preserve test coverage of source. The translation layers can retain original source test coverage by observing the source output via the TVR as shown in FIGS. 3A and 3B. Output of source can be sampled into the TL when the sink test is finished and the translated input is no longer needed.

Figure 4:
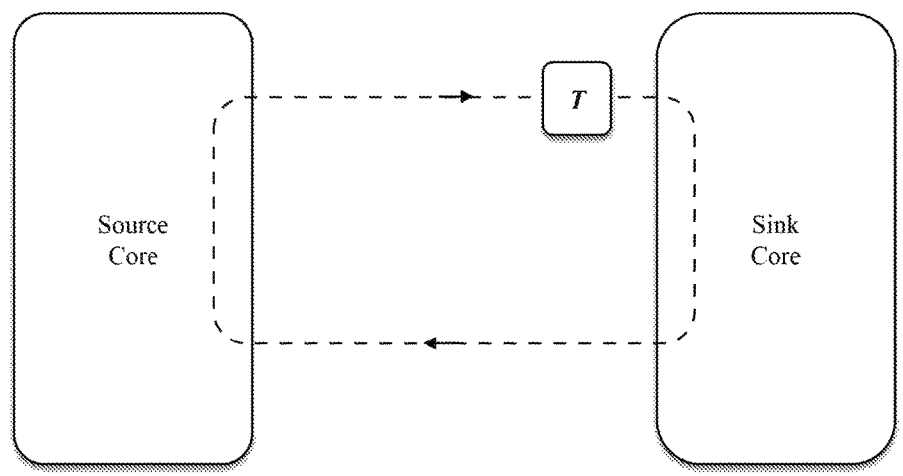
FIG. 4 illustrates an example of unstable input that may be caused by hazard or race in combinational feedback.

The translation layer can be integrated into core or separately inserted outside of core, as shown in FIG. 4. The translation layer defined in the Property 1 can be valid for integration of TL outside of cores. Since the TVR can be excluded from the core, it can be determined independent of the ATPG of core to satisfy any communication constraint. If the TL were integrated into the core, however, the ATPG of core can consider the TVR as a part of core logic. Content of the TVR resulted in the core test patterns, denoted as $tv_0$, should be considered in determination of the translation vector $g(x)$, in order to correctly account for input of the sink that depends on the $tv_0$. The TL can be considered the same except its input is changed from $v$ to $v \oplus tv_0$. The new TL, denoted by $T(x)$, can be similarly determined as follows.

Property 2
$v'=T(x)$, where $T(x)=g(x) \oplus x$, $g(x)=(v' \oplus x)$ and $x=v \oplus tv_0$
Proof
$v'=\{$Identity of $\oplus\}$
$v' \oplus (v \oplus tv_0) \oplus (v \oplus tv_0) = \{$let $x=v\ tv_0\}$
$T(x)=\{$let $g(x)=(v' \oplus x)\}$
$g(x) \oplus x$
(End of Property and Proof).

The $g(x)$ in Property 2 can be considered a general form of the $g(x)$ in Property 1. The $g(x)$, for example, can be obtained if the $tv_0=0$.

Input of the TL must be stable for its application. In order to meet the communication constraints, the output of source must be determined and stay unchanged prior to translation for the testing of sink. This is called a stable input constraint of TL or simply a stable input constraint. The stable input constraint can be summarized as
1. No combinational feedback in the IO logic of the composed netlist
2. No pass-through combinational path in the IO interface logic of each core
3. No two connected cores in the IODG can execute the test in parallel Feedback loop, as shown in FIG. 4, can cause the sink input to be unstable. The cores that are connected through combinational paths in intermediate cores can cause unstable input when their tests are executed in parallel. Conventional DFT methods are available to eliminate those combinational feedback and path in test mode. Commonly known method is to insert storage cells to break the combinational loop and the path in test mode. The cores that share no channel between them can always satisfy the stable input constraint, if no combinational path is present in the intermediate core that connect them. Those non-interacting cores can be identified from the IODG by graph coloring algorithm and their tests can be performed in parallel. Note that, without disabling the combinational paths, the cores that are not connected in the IODG but connected through the combinational paths in the intermediate cores cannot be colored in the same color. The IODG should be refined to indicate core connectivity due to the combinational paths. For the purpose of discussion, the IODG is to assume to contain all connectivity of cores.

A Topological view of the system incorporating the TL is shown in FIG. 5. The TL can be assigned to input or output of each core. In the scheme, the TL is assumed to be incorporated into input of each core. If the stable input constraint were satisfied, the test can be continued for all cores without initialization. Sequential depth needs not be increased in composition of test patterns for continued execution of the core tests because the TL can translate any test patterns.

Figure 6A:
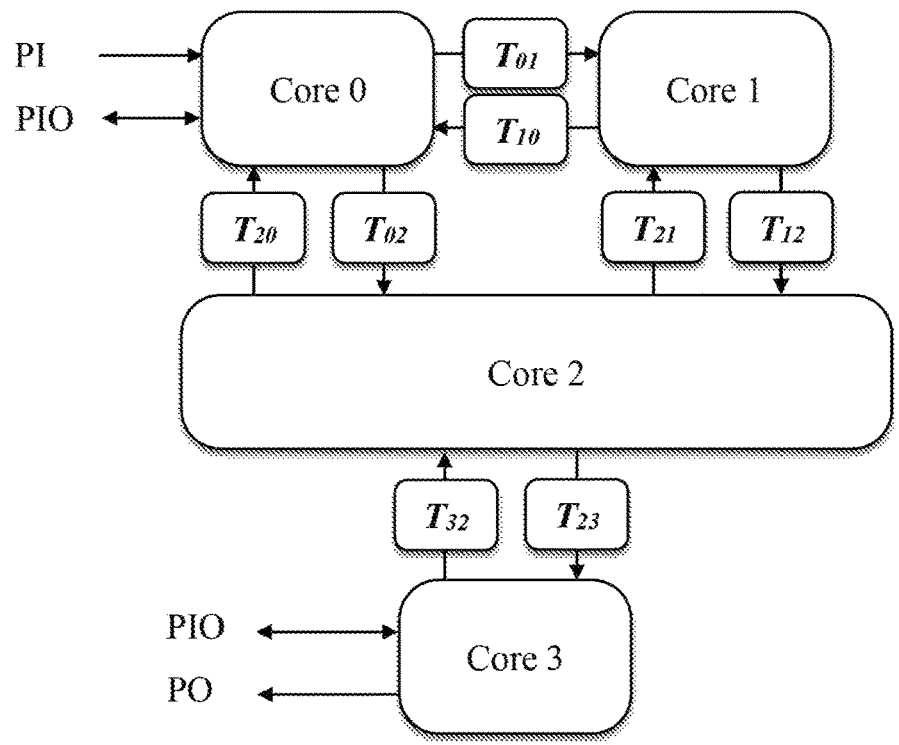
FIG. 6A is an example of translation layer integration.
Figure 6B:
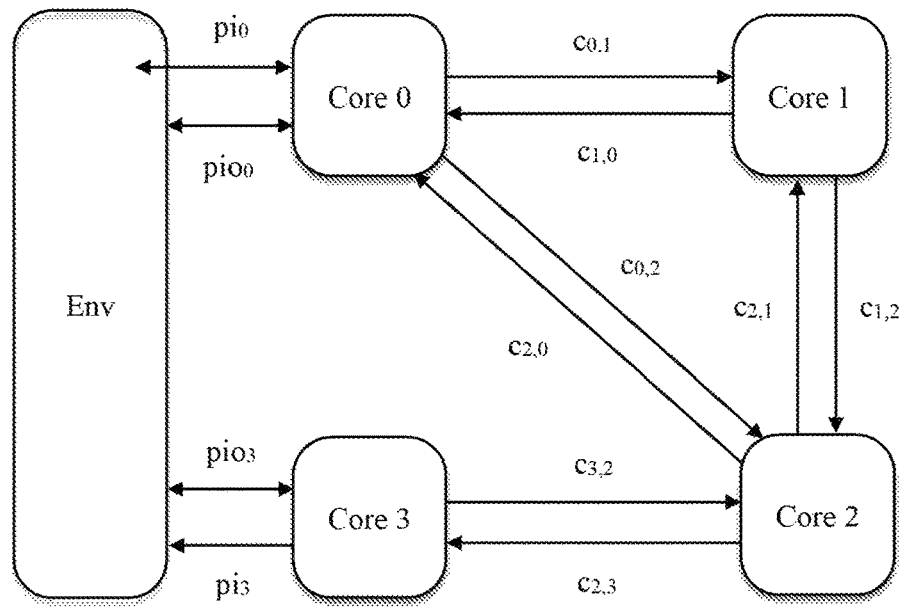
FIG. 6B is the corresponding Labelled IODG or topology.

Any sequence of core tests which can satisfy the stable input constraint and communication constraint is defined as a test sequence (TS). A parallel test of cores can be allowed in the test sequence. A set of cores to be tested in parallel can be obtained from the IODG by known graph coloring algorithms. For the example shown in FIGS. 6A and 6B, the test sequence can be $TS_0=\{$Core 1, Core 3$\} \rightarrow$Core 2$\rightarrow$Core 0. Since there is no channel between Core 1 and 3, they can satisfy the stable input constraint and their tests can be executed in parallel. Core 0 and 2, however, can't be tested in parallel because the testing of one can interfere with that of another, violating the stable input constraint. If the stable input condition is not met for any channel, any input to the channel cannot be reliably translated to meet communication constraints. Similarly, Core 1 cannot be tested in parallel with the Core 0 and 2. Therefore, the test sequences can be the testing of Core 1 and 3 can be performed in parallel followed by sequential test of Core 0 and Core 2. Note that Core 1 and 3 can be test in any order. There can be multiple test sequences, for example,
$TS_1=\{$Core 0, Core 1$\} \rightarrow$Core 3$\rightarrow$Core 2
$TS_2=$Core 0$\rightarrow$Core 1$\rightarrow$Core 2$\rightarrow$Core 3

The translation layers can be determined for a sequence of the core tests. The TL of sink, for example, can be determined to translate either output of source before or after the test, denoted as a pre- and a post-test output of source. If the test of source precedes that of sink, the TL of sink can be determined from the post-test output of source. Otherwise, the TL can be determined from the pre-test output. The output of source to be used in calculation of the TL can be determined by a precedence relation of test executions implied in the test sequence. The test sequence can be considered as a partially ordered set, or a poset. The poset is a set P and a binary relation≤such that for all a, b, and c in P, a≤a (reflexivity), a≤b and b≤a implies a=b (antisymmetry), a≤b and b≤c implies a≤c (transitivity)

The test sequence can be a poset with the P being a set of all cores in system under test and the binary relation≤being precedence of test execution. If source≤sink, the pre-test output of source can be used for calculation of the TL in the sink. Similarly, if sink≤source, the post-test output of source can be used. The $TS_0=\{Core\ 1, Core\ 3\} \rightarrow Core\ 2 \rightarrow Core\ 0$, for example, can be interpreted as a poset (P,≤)={(Core 1, Core 2), (Core 3, Core 2), (Core 2, Core 0), (Core 1, Core 0), (Core 3, Core 0)}. Thus, the TL of Core 2 can be determined from the post-outputs of both Core 1 and Core 3 and the pre-test output of Core 0. Calculation of the TL for the given test sequence $TS_0$ can be summarized as follows in Table 2.

TABLE 2

| Core | Translation Layer Equations |
| --- | --- |
| Core 0 | $T_{1,0} = output(c_{1,0}) \oplus post(input(c_{1,0}))$ |
|  | $T_{2,0} = output(c_{2,0}) \oplus post(input(c_{2,0}))$ |
| Core 1 | $T_{0,1} = output(c_{0,1}) \oplus pre(input(c_{0,1}))$ |
|  | $T_{2,1} = output(c_{2,1}) \oplus pre(input(c_{2,1}))$ |
| Core 2 | $T_{0,2} = output(c_{0,2}) \oplus pre(input(c_{0,2}))$ |
|  | $T_{1,2} = output(c_{1,2}) \oplus post(input(c_{1,2}))$ |
|  | $T_{3,2} = output(c_{3,2}) \oplus post(input(c_{3,2}))$ |
| Core 3 | $T_{2,3} = output(c_{2,3}) \oplus pre(input(c_{2,3}))$ |

The TL can be expressed in terms of source and sink of the channel. The output of source and the input of sink can be the input and the output of channel, respectively. Let source x and sink y to denote Core x and Core y, respectively. Input of the sink y is the output of channel $c_{x,y}$, denoted by $output(c_{x,y})$. Similarly, the pre and post-output of the source x can be the pre and post-input to the channel $c_{x,y}$, denoted as pre and $post(input(c_{x,y}))$, respectively. The TL can be obtained by bit-wise XOR operation of the $output(c_{x,y})$ with the pre or $post(input(c_{x,y}))$ depending on the precedence relation defined in the test sequence.

Each core can comprise multiple clock domains. Multiple clock domains can have the same communication constraints as the cores in system under test. Without resolution of the communication constraints, achievement of parallel ATPG, test pattern reuse and high test pattern utilization can be difficult. As a consequence, continued test execution of all clock domains in the same test pattern may require a sequential ATPG that may involve all clock domains. The sequential ATPG incorporating all clock domains can increase test pattern count and test development cost. The translation layer can be similarly applied to multiple clock domains to achieve high utilization by reusing independently generated test patterns obtained from the parallel ATPG of cores. The TL can eliminate a need of sequential ATPG that is to satisfy communication constraints of any test sequence.

Figure 7:
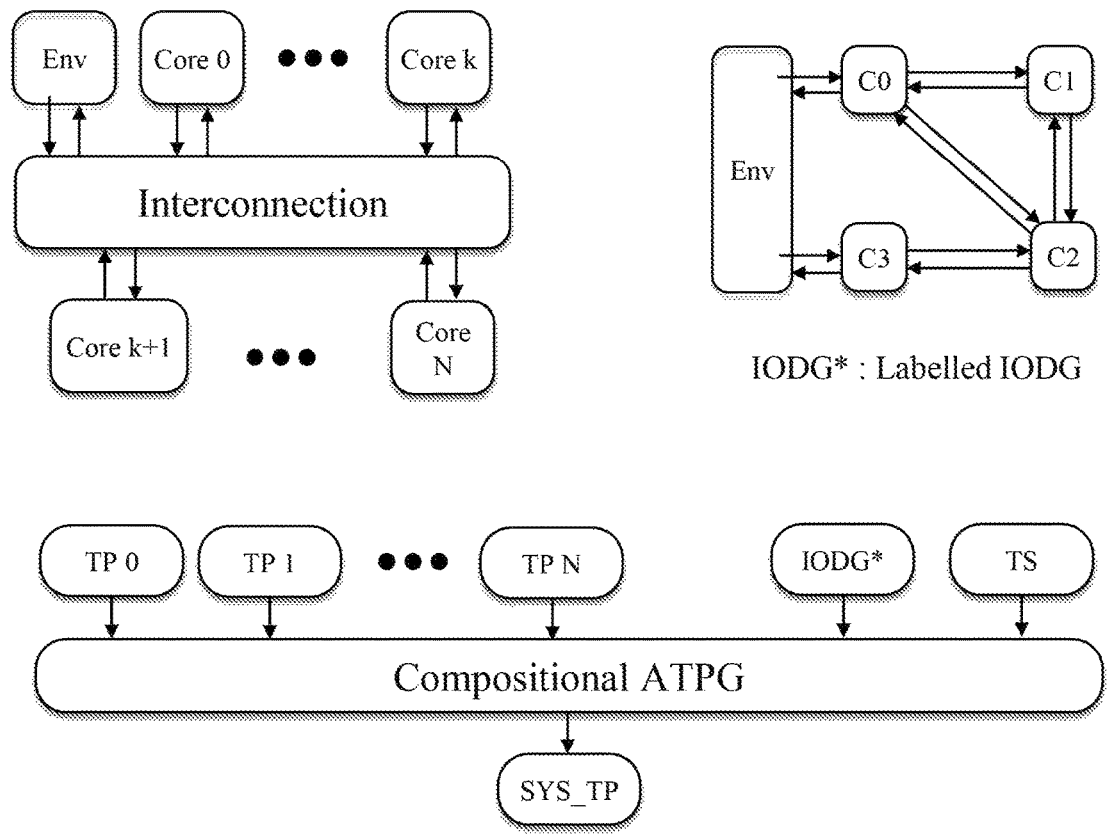
FIG. 7 is an Overview of Compositional ATPG.

An overview of compositional ATPG is summarized in FIG. 7. For a given system under test, test patterns of cores can be independently generated in parallel. The core test patterns can be reused for various test sequences depending on test applications. Generated core test patterns can be composed to form test patterns of a higher-level of design hierarchy or a target system. The composition of test patterns can be summarized in the following steps:

1. Generate test patterns of all cores in parallel
2. For a given test sequence and IODG, compute the translation vectors for all sinks specified in the IODG
3. Combine the core test patterns with the translation vectors to obtain test patterns of the target system Composition of test patterns can amount to computation of translation vectors based on a given set of core test patterns, test sequence and a labelled IODG. Computation of the translation vectors for each core can require the test patterns of both core and test environment in which the core test is applied to. The test environment of core can comprise system excluding the core and system environment. The test environment can provide inputs and observe outputs of core in a targeted test. The test environment of the core can be potentially quite large and complex in 3D integrated circuits (ICs).

To cope with complexity and test development challenges, any design entity or core can be represented with its test patterns for context of the test. Test environment specification can be defined for each design entity as its input and output requirements. The test environment specification can be obtain from the test patterns of the design entity by reversing IO direction. The test environment specification can be employed in construction of test environment for any level of design hierarchy and resolution of communication constraints.

The test patterns of core can be viewed as a stream of inputs and outputs of which the core can be allowed to engage in a given test. The stream of IO specified in the test patterns can be considered as an IO behavioral specification. Similarly, the test environment specification of the core can be considered a set of test patterns that specify inputs to and outputs from the core in a targeted test. A set of all inputs and outputs of the test environment specification are denoted as the ITE and OTE, respectively. Note that the core and its test environment specification can form a closed system and the translation vectors between them are all zero. The translation vectors can indicate disagreements between the core inputs and their corresponding test environment outputs. The test environment of core can be specified by the OTEs of sources for input of the core and the ITEs of sink for output. Hence, the ITE of the core can be satisfied by the OTEs of sources through the translation and the OTE by the ITEs of sinks.

The test environment of the core can be specified in the following format shown in Table 3.

TABLE 3

| Test Pat. No. | Input Test Environment (ITE) | Output Test Environment (OTE) |
| --- | --- | --- |
| TP# | LI, TI | LO, TO |

Input and output specifications of the test environment can be provided in the ITE and the OTE sections of the test pattern format, respectively. For the core under test, there are leading inputs (LIs), leading outputs (LOs), trailing inputs (TIs), and trailing outputs (TOs). Each test pattern of the test environment can be enumerated with the same test pattern number as that of the core to maintain their correspondence or mapping. The ITE of the core can be satisfied by the OTEs of the sources through the translation. Similarly, the OTE of the core can be translated into the ITEs of the sinks to provide the required test input. The translation can enable the output of the core to be checked not only by the sink test but also by the translation layers at the end of the sink test.

The test patterns of core x can be defined as $$\text{CORE\_TP}_x = \{\text{CORE\_TP}_x[x.i] 0 \le x.i < \text{tp\_count}(\text{CORE\_TP}_x)\} \quad \text{Eq. 11}$$

where $\text{CORE\_TP}_x[x.i]$ denotes the test pattern that corresponds to the test pattern number x.i in the $\text{CORE\_TP}_x$ and the tp_count(Y) a function that returns a number of test patterns in the Y. Note that each test pattern is enumerated by the test pattern number and hence can be uniquely identified. CORE_TP can be considered a set of all test patterns that can be addressed by the test pattern number. Each test pattern $\text{CORE\_TP}_x[x.i] \in \text{CORE\_TP}_x$ can be addressed by the pattern number prefixed with a core name or address. Similarly, a set of all independently generated test patterns of cores in the system under test, denoted as SYS, can be defined as $$\text{CORE\_TP}_x = [\text{CORE\_TP}_x | \text{Core } x \in \text{cores}(\text{SYS})] \quad \text{Eq. 12}$$

A set of inputs and outputs that the test environment are required to provide and observe are called input and output test environments of core x, $\text{ITE}_x$ and $\text{OTE}_x$, respectively. The $\text{ITE}_x$ and $\text{OTE}_x$ can be specified as $$\text{ITE}_x = \{x \# \text{TP} \# .x.\text{LI}.x.\text{TI}) | 0 \le x.\#\text{TP} \# < \text{tp\_count}(\text{CORE\_TP}_x)\} \quad \text{Eq. 13}$$

$$\text{OTE}_x = \{x.\#\text{TP} \# .x.\text{LO}.x.\text{TO}) | 0 \le x.\#\text{TP} \# < \text{tp\_count}(\text{CORE\_TP}_x)\} \quad \text{Eq. 14}$$

A set of all $\text{ITE}_x$ and the $\text{OTE}_x$, can be defined as $$\text{ITE} = \{\text{ITE}_x | \text{Core } x \in \text{cores}(\text{SYS})\} \quad \text{Eq. 15}$$

$$\text{OTE} = \{\text{OTE}_x | \text{Core } x \in \text{cores}(\text{SYS})\} \quad \text{Eq. 16}$$

Satisfaction of communication constraints can imply the input to be provided from the test environment and the output observed. The satisfiability relation between a test environment $P_x$ of core x and the test environment $Q_y$ of core y, can be defined as $$(P_x \text{ sat } Q_x) = \{(P[x.i], Q[x.i]) | 0 \le x.i < \text{tp\_count}(Q_x), Q[x.i] = T(P[x.i])\} \quad \text{Eq. 17}$$

Satisfiability relation can indicate that test environment can fulfill communication constraints in test patterns of corresponding core. Satisfiability relation can be similarly defined for each test pattern of test environment $p \in P_x$ and a core test pattern $q \in Q_x$ as p sat q, if q=T(p). The satisfiability relations ($\text{ITE}_x$ sat $\text{CORE\_TPI}_x$) and ($\text{OTE}_x$ sat $\text{CORE\_TPO}_x$) can be considered satisfaction of controllability and observability, respectively.

The test patterns of the target system, denoted as SYS_TP, can be considered a mapping that links the test patterns of source to those of the sink with the translation vectors that can satisfy communication constraints between them.

SYS_TP:CORE_TP×CORE_TP→TV
TV:OTE→ITE where the TV is a set all translation vectors that can satisfy communication constraints. Cartesian product of test patterns are denoted with × and a mapping or a function with →.

The TV can be viewed as a function that can map the output of source specified in the OTE of the source to the input of sink specified in the ITE of the sink to satisfy communication constraints. The IODG can provide channel connectivity information to identify source and sink for the test. The test sequence can be employed to determine the translation vectors based on the pre- or post-test of the source output. The calculated translation vectors can be combined with corresponding core-level test patterns to form system-level test patterns.

With an assumption that the translation layer can be incorporated into the input of each core, targeted system-level test patterns, denoted as SYS_TP, can be expressed in terms of the test pattern numbers of source and sink and the translation vectors that link corresponding test patterns according to the IODG as SYS_TP={(x.i, y.j, tv)|∀x,y∈cores(SYS),
 0≤x.i<tp_count($\text{OTE}_x$), $\text{OTE}_x \in \text{OTE}$,
 0≤y.j<tp_count($\text{ITE}_y$), $\text{ITE}_y \in \text{ITE}$,
 tv∈TV}

The definition of SYS_TP can imply that the tp_count($\text{ITE}_x$)=tp_count($\text{ITE}_y$) and hence tp_count($\text{CORE\_TP}_x$)=tp_count($\text{CORE\_TP}_y$) after composition of test patterns, if test coverage were to be preserved in both source and sink.

If source were registered-output design or its outputs were registered, the output registers can be used to provide input of sink directly for test pattern composition. The output registers, however, can be modified after the source test. The test sequence must account for such limitations in scheduling of the core tests for optimized utilization. Even in case of the registered-output, the translation layers can be applied to overcome the limitations and to lower test development costs.

The composition of test patterns in multi-processor environment can expedite test development of a large system to meet an aggressive time-to-market demand, and thereby increasing the competitive advantage. One commonly cited approach is exploiting parallelism offered in multiprocessor computers. The effectiveness of parallelism corresponds to whether the problem can be efficiently scaled to use the computing environment. To increase scalability, input-output dependencies of the cores that comprise the system under test can be ignored to allow parallel ATPG of individual cores. The disregarded or unused IO dependencies can be recovered by the translation layer during composition of the test patterns to form system test patterns.

The test environment can be structured to exploit parallelism. The test environment of the core can specify input and output requirements of the core for a given test. It can encapsulate the core for a given test and allow the independent ATPG. The test environment of each core can be exchanged for computation of the translation vectors and for test coverage closure. The translation vectors for each core can be efficiently computed from the OTE of the source and the ITE of the sink. Computation of translation vectors from the exchanged test environments to satisfy the communication constraints can cost far less than generation of system test patterns based on a netlist of integrated cores to satisfy the same constraints.

Figure 8:
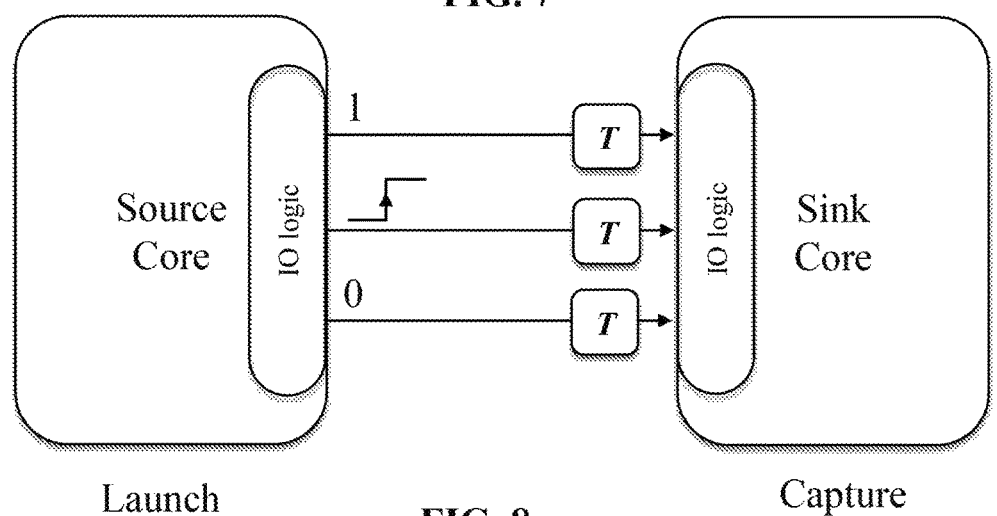
FIG. 8 is an example of translation of logic values and transition in inter-core testing.

System level test may involve interaction of cores. Interaction of cores can be required in the testing of their interface logic. Examples of such tests can be inter-core test and inter-clock domain test. In those tests, as shown in FIG. 8, input stimulus transition can be launched from one core, clock domain or source and captured into another or sink. In order to satisfy the communication constraint, transitions in the output test environment of source and the input test environment of sink, should be synchronized or matched. The translation layer can translate any transition and logic value to satisfy the communication constraint. If the transitions were not matched due to absence of transitions in either test environment, communication constraints can be satisfied by addition of supplemental test patterns that contain the required transitions in composition of test patterns. The supplemental test patterns can be generated by ATPG based on the test environments of source and sink. If the ATPG must allow excessive number of transitions in the test patterns, those unwanted transitions can be filtered by control points that can block propagation of unnecessary transitions. The control points can be incorporated into the core output or the input of the TL.

Since the composition of test patterns is based on channels, test environment of channel can be useful for computation of the translation vectors. The test environment of a channel $c_{x,y}[n-1:0]$ established from the test environment x to the y can be defined by projection of the test environment on the channel of interest. Projection of the $OTE_x$ to the channel of interest $c_{x,y}$ can be defined as follows.

For a given $OTE_x = \{(x.TP\#, x.LO, x.TO) \mid 0 \leq x.TP\# < tp\_count(CORE\_TP_x)\}$, $OTE_{xy} = OTE_x \uparrow (out\_channels(x) \cap in\_channels(y))$ $= \{ote(x) \mid 0 \leq x.\#TP\# < size(OTE_x)\}$ $ote(x) = \underline{A}(i:0 \leq i \leq n-1, x.out[i] \in (out\_channels(x) \cap in\_channels(y))$:

$(x.\#TP\#, x.LO \uparrow x.out[n-1:0], x.TO \uparrow x.out[n-1:0]))$

Note that if $out\_channels(x) \cap in\_channels(y)$ were empty, then the $OTE_{x,y}$ is empty. In the definition of the ote(x), universal quantification is denoted by $\underline{A}(L:D:E)$ where $\underline{A}$ is a quantifier for all, L is a list of variables, D is a predicate and E is the quantified expression. Each field of the $OTE_x$ can be addressed by a dot extension. Projections of a number of bits in the x.LO and x.TO on the specified bits of the x.out are denoted as $x.LO \uparrow x.out[n-1:0]$ and $x.TO \uparrow x.out[n-1:0]$, respectively. The projection $x.LO \uparrow x.out[n-1:0]$ or $x.TO \uparrow x.out[n-1:0]$ can extract the bits corresponding to the x.out [n-1:0] from the x.LO or the x.TO, respectively, if exists. Otherwise, no bit can be extracted. Similarly, projection of the $ITE_y$ on a channel of interest $c_{x,y}$ can be defined as For a given $ITE_y = \{(y.\#TP\#, y.LI, y.TI) \mid 0 \leq y.\#TP\# < tp\_count(CORE\_TP_y)\}$, $ITE_{xy} = ITE_y \uparrow (out\_channels(x) \cap in\_channels(y))$ $= \{ite(y) \mid 0 \leq y.\#TP\# < size(ITE_y)\}$ $ite(y) = \underline{A}(i:0 \leq i \leq n-1, y.in[i] \in (out\_channels(x) \cap in\_channels(y))$:

$(y.TP\#, y.LI \uparrow y.in[n-1:0], y.TI \uparrow y.in[n-1:0]))$

Similarly, if $out\_channels(x) \cap in\_channels(y)$ were empty, then the $ITE_{x,y}$ is empty. The $OTE_{x,y}$ and the $ITE_{x,y}$ are called an input and output test environment of channel $c_{x,y}$, respectively. They contain only leading and trailing IO of the channel of interest. The translation vectors for pre- and post-test of source, denoted as $PRE\_TV_{x,y}$ and $POST\_TV_{x,y}$ respectively, can be calculated from the $OTE_{x,y}$ and the $ITE_{x,y}$ as $PRE\_TV_{x,y} = $
$\underline{A}(i,j:0 \leq x.i < size(OTE_{x,y}), 0 \leq y.j < size(ITE_{x,y})$:
$TV_{x,y}[x.i,y.j] = OTE.LO_{x,y}[x.i] \oplus ITE.LI_{x,y}[y.j])$     Eq. 18

$POST\_TV_{x,y} = \underline{A}(i,j:0 \leq x.i < size(OTE_{x,y}), 0 \leq y.j < size(ITE_{x,y}):TV_{x,y}[x.i,y.j] = OTE.TO_{x,y}[x.i] \oplus ITE.LI_{x,y}[y.j])$     Eq. 19

The $TV_{x,y}[x.i,y.j]$ can contain difference of the x.i-th and y.j-th n-bit translation vectors of the $OTE_{x,y}$ and the $ITE_{x,y}$, respectively. Note that the index i can be the same as the j. The $TV_{x,y}[x.i, y.j]$ can be obtained by a n-bit bit-wise XOR of the $ITE.LI_{x,y}[y.j]$ and the $OTE.LO_{x,y}[x.i]$ in PRE_TV or of the $ITE.LI_{x,y}[y.j]$ and the $OTE.TO_{x,y}[x.i]$ in POST_TV. The bit-wise XOR operation assumes that the number of test patterns in the $ITE_{x,y}$ and the $OTE_{x,y}$ are the same to preserve test coverage of both Core x and y, or $size(OTE_{x,y}) = size(ITE_{x,y})$. This assumption, however, can be satisfied by extending the shorter test patterns until the test pattern count in both the $ITE_{x,y}$ and $OTE_{x,y}$ are the same. If, for example, the $size(ITE_{x,y}) - size(OTE_{x,y}) = d$ and $d > 0$, the $OTE_{x,y}$ can be extended with the d number of test patterns of the $OTE_{x,y}$ with new test pattern numbers by repeating d number of test patterns at the end to complete the bit-wise XOR with the $ITE_{x,y}$. Equalization of test pattern count to cover the longer test patterns can be important for preservation of test coverage, as discussed earlier. Note that all test patterns are unique with respect to their test pattern numbers in the equalized test patterns.

Composition of test patterns of cores that do not interact during the test can be summarized as follows:
1. From inputs; IODG and test sequence TS,
2. Generate test patterns of all cores and their test environments in parallel
   a. obtain $CORE\_TP_x$, $ITE_x$ and $OTE_x$
3. From a given IODG, for each core y and for all its source x and sink z
   a. Compute output channel environment $ITE_{x,y}$
   b. Compute input channel environment $OTEy_{y,z}$
   c. Send $OTE_{y,z}$ to the sink z and receive $OTE_{x,y}$ from the source x
4. equalize test pattern count of $OTE_{x,y}$ and $ITE_{x,y}$ by extension
   a. Obtain $tp\_count(OTE_{x,y}) = tp\_count(ITE_{x,y})$
5. Compute $TV_{x,y}$ from $OTE_{x,y}$ and $ITE_{x,y}$ for a given test sequence TS
   a. $\forall x,y$. {if source x executes the test before sink y, compute $TV_{x,y} = POST\_TV_{x,y}$ else compute $TV_{x,y} = PRE\_TV_{x,y}$}
6. Construct SYS_TP by composing the core test patterns with the $TV_{x,y}$
   a. $SYS\_TP = \{(Core\_TP_x[x.i], Core\_TP_y[y.i], TI_{x,y}[x.i, y.j]) \mid \forall x,y$. Core x, $y \in cores(SYS)$, $0 \leq x.i < tp\_count(Core\_TP_x)$, $0 \leq y.j < tp\_count(Core\_TP_y)$, $TV_{x,y}[x.i, y.j] \in TV_{x,y}\}$ Synchronization of transitions can be crucial for the at-speed testing of the IO logic of interacting cores. The test environment of each core can provide a specification of communication constraints of transitions for the targeted test. Controllability requirement of input transitions can be specified in the ITE and observability requirement of output in the OTE. Transition test coverage of the IO logic can be preserved if both requirements can be satisfied.

Location and polarity of transitions in each test environment can be calculated from the leading and trailing values in the test pattern. Polarity of transition can indicate whether the transition is a rising or a falling. Location of the transition can be identified by bit-wise XOR operation of the leading and trailing values. Presence of transition in the k-th bit of core input and output, for example, can be indicated by LI[k]⊕TI[k]=1 and LO[k]⊕TO[k]=1 for all k, respectively. From the transition, polarity of the transition can be identified by leading or trailing value of the transition. If the leading (trailing) value were logic 0, the transition can be a rising (falling) transition. Otherwise, it is a falling transition. Location and polarity of transition in the k-th bit input and output are summarized in Table 4. The L[k] and the T[k] can denote either LI[k] and TI[k] or LO[k] and TO[k].

TABLE 4

| L[k] | T[k] | L[k] ⊕ T[k] | Transition |
|---|---|---|---|
| 0 | 0 | 0 | No transition |
| 0 | 1 | 1 | Rising transition |
| 1 | 0 | 1 | Falling transition |
| 1 | 1 | 0 | No transition |

Note that, with an aid of the translation layer T, the $OTE_{x,y}$ can provide any transition in the $ITE_{x,y}$, if the following can be satisfied $$A(j:0 \leq j < size(ITE_{x,y}):(ITE.LI_{x,y}[j] \oplus ITE.TI_{x,y}[j]) \neq 0,$$
$$E(i:0 \leq i < size(OTE_{x,y}):(OTE.LO_{x,y}[i]OTE.LO_{x,y}[i] \oplus$$
$$OTE.TO_{x,y}[i]) \oplus (ITE.LI_{x,y}[j] \oplus ITE.TI_{x,y}[j]) = 0))$$

where $ITE.LI_{x,y}[j]=T(OTE.LO_{x,y}[i])$ and $ITE.TI_{x,y}[j]=T(OTE.TO_{x,y}[i])$
where the E denotes an existential quantifier that can be similarly defined as the universal quantifier A. The bold-case zero or 0 denotes a multi-bit zero vector that is the same size as the operand. Since the translation layer T can translate any polarity of transition into one of two possible polarities of transitions, any transition in the $OTE_{x,y}$ can be sufficient to provide all possible polarities of the synchronized transitions in the $ITE_{x,y}$.

The test pattern format of core can be extended to include the test environment for test pattern composition as

| Test Pat # | Internal Reg | | ITE | | OTE | |
|---|---|---|---|---|---|---|
| TP # | SI, TVI | SO, TVO | PI | TI | PO | TO |

The SI denotes scan input to initialize internal registers of the core under test and the SO the test response to be brought out from the same internal registers after the test. The TVI denotes the translation vectors to be delivered to the TVR before the test for translation. The TVO denotes the output of source captured into the TVR after the sink test for recovery of source test coverage. The PI denotes the applied primary input to produce the primary output and the PO the expected primary output to be compared with the produced for test decision. The PI can be the leading value of the test environment and can correspond to the LI in the test environment. Similarly, the PO can be the leading value and can correspond to the LO in the test environment. The PI and TI are inputs to be provided to the core under test from the test environment through the TL. The PO and the TO can be considered as the expected pre- and the post-test outputs to be measured by the test environment, respectively. The PI and the TI of the core under test can be the translated version of the PO and TO of source, respectively. The PI (PO) and the TI (TO) can be the same for the core test and different for the inter-core test. For the inter-core test, the launch transition can be specified in the PI and the TI and captured in the core under test. The PO and the TO can provide transitions to sink. A set of all pairs (PI, TI) and (PO, TO) can form the ITE and OTE of the core, respectively. Note that, for the testing of interacting cores, the final value of source output, or the TO of source, must be synchronized to the PI of sink for the core test and the pair (PO, TO) to (PI, TI) for inter-core test.

The extended test pattern format can be only used internally for composition of test patterns. The TI and TO, for example, are present for computation of the translation vectors and and can be removed from the final test patterns that are employed in manufacturing test.

After composition of the test patterns, the final manufacturing test patterns can be written out in the following format:

| TP # | SI, TVI | SO, TVO | $PI_{SYS}$ | $PO_{SYS}$ |
|---|---|---|---|---|

As noted, addition of the translation vectors is main difference compared to the conventional test pattern format. The $PI_{SYS}$ and the $PO_{SYS}$ can denote inputs and outputs connected to primary inputs and primary outputs of the system under test. Input and output of the core that are connected internally can be removed from the test patterns. The translation vector registers can be assigned to the internal input of the sink. Thus, the size($PI_{sys}$)=size(PI)−size (TV) in each test pattern of any core, where the size(x) denote a number of bits in x.

The translation layer can function as a test point and improve testability. The translation layer can transform any source output transition and logic value into the required sink input (controllability). It can also measure the output of source after the sink test (observability).

Aim of the at-speed inter-core test (ICT) is to detect delay faults in IO logic of interacting cores. Example of the inter-core test is depicted in FIG. 8. The at-speed ICT can be achieved by providing transition stimulus from source through its output logic and observe expected output transition at sink through its input logic. For the ICT, a set of synchronized output transitions of source and input transitions of sink through the TL can determine test coverage. The output transitions of source can be provided in the OTE of source and the required input transitions of sink in the ITE of sink. The TL can translate elements of the OTE to match those of the ITE. In order to preserve the original transition test coverage of independently generated test patterns of both source and sink, the OTE of source can be required to provide transitions in the ITE of sink through the TL. Propagation of the provided transitions through the IO logic of sink is implied, if those transitions are included in the ITE.

Cores can comprise multiple clock domains. The at-speed inter-clock domain test (ICDT) of multiple clock domains can be performed the same way as the ICT, if the translation layer is incorporated between source and sink clock domains. Since both the ICT and the ICDT can be essentially the same test, the ICT method discussed in the scheme can be equally applied to the ICDT.

Both source and sink can interact with multiple sinks and sources, respectively. With an aid of the ATPG and the test points that can block unwanted transitions discussed earlier, synchronization of transitions can be achieved in composition of test patterns. The ATPG, for example, can be constrained to generate test patterns that contain maximum of one transition in the OTE and the ITE. Those transitions can be synchronized in the test pattern composition by translation of output transitions of source from the OTE to match the required input transitions of sink specified in the ITE. Alternatively, the ATPG of source can generate optimal test patterns for test coverage that contain more than one transitions in the OTE. The test points can block unwanted transitions at the output of source for synchronization. The control points can only active during the inter-core test. The control value for the test points can be don't-care, if the output does not produce a transition. Since practical applications of the ICT, however, can involve a single source and a single sink in each at-speed transition test among the interacting cores, the scheme assumes a single source and a single sink for the purpose of discussion. Multiple ICT and ICDT can be scheduled in each test pattern or in the test sequence. The ATPG can be constrained to generate maximum of one transition in the OTE of source and in the ITE of sink for each ICT test in the test sequence.

Composition of inter-core test patterns can be efficiently managed by employment of a channel test environment. The channel test environment can be the OTE of source and the ITE of sink with respect to the channel that source and sink communicate. The ITE of sink y, for example, can be partitioned with respect to channels that are connected to each source x, i.e. $\hat{A}(x:0 \le x \le X:ITE_{x,y})$. Similarly, the OTE of source x can be partitioned with respect to the channels that are connected to each sink, or $\underline{A}(y:0<y \le Y:OTE_{x,y})$. The translation layer can be applied to resolve communication conflicts between the $OTE_{x,y}$ and the $ITE_{x,y}$ for all x and y. The channel test environment can allow flexible construction of the test environment in various test applications.

The transitions that can be propagated from source to sink through their IO logic can determine at-speed test coverage. Those transition can be obtained by matching the transitions in $\underline{A}(x:0<x \le X:OTE_{x,y})$ with those in $\underline{A}(x:0 \le x \le Y:ITE_{x,y})$. For preservation of test coverage, the $ITE_{x,y}$ is required to be satisfied by corresponding $T(OTE_{x,y})$ for all x and vice versa for all y. Since any static values and polarity of transitions can be satisfied by the translation layer T, composition of test patterns for inter-core test patterns can be amounted to synchronization of transitions in the $T(OTE_{x,y})$ and the $ITE_{x,y}$. For unequal number of test patterns in the OTE and the ITE, test patterns of the smaller test environment can be expanded to match the larger by duplication of exiting test patterns and addition of new test patterns. If additional test patterns are required for synchronization of transitions, for example, the channel test environment of the counterpart can be used as the ATPG constraint for generation of additional test patterns.

The translation layer can allow to focus on presence of transitions and not their polarities in the ITE and the OTE. A set of test patterns that include transitions in the OTE and the ITE, denoted by tr(OTE) and tr(ITE) respectively, can be defined as $$tr(OTE)=\{(\#TP\#,LO,TO)|one(LO\oplus TO)\ge1,(\#TP\#,LO,TO)\in OTE\} \quad \text{Eq. 20}$$

$$tr(ITE)=\{(\#TP\#,LI,TI)|one(LI\oplus TI)\ge1,(\#TP\#,LI,TI)\in ITE\} \quad \text{Eq. 21}$$

where one(x) denotes a function that returns a number of ones in x and where $\oplus$ is a bitwise XOR of two n-bit vectors, where $n \ge 1$.

A single transition test pattern in the ITE and the OTE, denoted by sgtr(ITE) and sgtr(OTE), can be defined as a test pattern that satisfies $one(LI \oplus TI)=1$ and $one(LO \oplus TO)=1$, respectively. The signal transition test patterns can be generated by ATPG tools. Or, the sgtr(OTE) can be obtained with an aid of the control points discussed earlier. If the $sgtr(OTE_{x,y})$ can provide a transition for each output of source, it can provide any transition required by the sgtr ($ITE_{x,y}$). With an aid of the translation layer, the sgtr(OTE) can satisfy the ITE and hence, test coverage of sink input logic can be preserved. Similarly, if the $sgtr(ITE_{x,y})$ can propagate any transition of the $sgtr(OTE_{x,y})$ provided in the input of sink, test coverage of source output logic can be preserved. Therefore, if the ATPG can produce the sgtr ($OTE_{x,y}$) and the $sgtr(ITE_{x,y})$ that contains transitions for each output and input respectively, they can be repeatedly applied to test all of transitions in the $OTE_{x,y}$ and the $ITE_{x,y}$ for all x and y.

In composition of test patterns, it may be beneficial to identify which transition in the OTE can provide or satisfy required transition in the ITE. Transition satisfiability relation $R_{x,y}$ can be defined for all transitions included in the OTE and the ITE respectively as $R_{x,y} = \underline{A}(i,j:0 \le i<size(OTE), \quad 0 \le j<size(ITE_y),$
$\quad one(x.LO[i] \oplus x.TO[i]) \ge 1, \quad one(y.LI[j] \oplus y.TI[j]) \ge 1,$
$\quad (x.LO[i] \oplus x.TO[i]) \oplus (y.LI[j] \oplus y.TI[j])=0: \quad (x.\#TP\#,$
$\quad y.\#TP\#)), \text{ where } y.LI[j]=T(x.LO[i]) \text{ and } y.TI[j]=T(x.TO[i])$ The relation $R_{x,y}$ can specify synchronization relation of test patterns. It can prescribe which test patterns in the OTE of source and the ITE of sink to be applied for the testing of both the output logic of source and the input logic of sink. There can be multiple test patterns of one test environment that can satisfy a test pattern of another. Each test pattern, however, can be enumerated with the test pattern number and can be distinct. Composition of test patterns must preserve all test patterns in the test environments of both source and sink to preserve test coverage. In other words, the test patterns in the OTE and ITE can be duplicated to equalize the pattern counts but never removed.

Composition of the at-speed test patterns for the ICT can be amount to computation of the transition satisfiability relation $R_{x,y}$.

Composition of test patterns for the inter-core test can be summarized as follows:

1. Generate at-speed test patterns of all cores and their test environments in parallel
    1. From a given IODG, for each y and for all its source x and sink z that are scheduled for the ICT or the ICDT test with y
    2. Compute $sgtr(ITE_{x,y})$ for inter-core test from x to y
    3. Compute $sgtr(OTE_{y,z})$ for inter-core test from y to z
2. Communicate $ITE_{x,y}$ and $OTE_{x,y}$ to source and sink of y, respectively
    1. Send $sgtr(ITE_{x,y})$ to and receive $sgtr(OTE_{x,y})$ from core x
    2. Send $sgtr(OTE_{y,z})$ to and receive $sgtr(ITE_{y,z})$ from core z
3. Compute transition satisfiability relation $R_{x,y}$ for all x and y
4. For each sink y, compute translation vectors from output of source x,
    1. $TV_{x,y} = \underline{A}(i,j:0 \le i<size(OTE_{x,y}), 0 \le j<size(ITE_{x,y}), (x.i, y.j) \in R_{x,y}: TV_{x,y}[x.i, y.j]=x.TO[i] \oplus y.LI[j])$ In step 1, the ATPG of all cores and their ITE and OTE can be performed in parallel. The test patterns can be generated in the expanded format that contain the ITE and the OTE. The ITE and the OTE can be obtained from the generated test patterns. The ITE and the OTE can be interpreted as input controllability and output observability requirements of the core test y, respectively. The test patterns that contain a single transition in its channel environments, or the sgtr ($ITE_{x,y}$) and the $sgtr(OTE_{y,z})$, are generated in step 1 based on the assumption that the generated test patterns can satisfy the $sgtr(OTE_x)$, $sgtr(ITE_y)$, $sgtr(OTE_y)$ and the $sgtr(ITE_z)$. The $sgtr(ITE_{x,y})$ and the $sgtr(OTE_{x,y})$ focus on transitions that contribute to test coverage. The sgtr($ITE_{x,y}$) and the sgtr($ITE_{y,z}$) can be communicated to source x and sink z for inter-core test, respectively in step 2. The transition satisfiability relation is defined to synchronize the test patterns of source and sink for composition of test patterns. The synchronized test patterns are indicated by the satisfiability relation $R_{x,y}$. The satisfiability relation $R_{x,y}$ is computed in step 3. Finally, the translation vectors of the transition test patterns are calculated in step 4. The x.TO[i] in calculation of the $TV_{x,y}$[j] is the output of source x after launch.

In some test applications, the composed inter-core test patterns may need to be supplemented with additional test patterns to recover the original test coverage implied in the ITE and the OTE of each core. Note that the ITE and the OTE can specify the input and output conditions that can achieve maximum test coverage of the input logic and the output, respectively. In other test applications, the inter-core test patterns can be preferably generation based and not composition based. Generation of the inter-core test patterns can be performed in parallel using the ITE and the OTE of each core.

Generation of the inter-core test patterns can be summarized as follows:

5. $U_{x,y}=OTE_{x,y} \cup ITE_{x,y}$; otpn=size($OTE_x$); itpn=size($ITE_y$);
while ($U_{x,y} \neq \emptyset$) begin
  p=u, u∈$U_{x,y}$;
  k=tp_num(p);
  if (p∈$OTE_{x,y}$) & (one(x.LO[k]⊕x.TO[k])≥1) & ((x.k, _)∉$R_{x,y}$)
    Generate test pattern of y with the tp#=itpn such that one((x.LO[k]⊕x.TO[k])⊕(y.LI[itpn]⊕y.TI[itpn]))=0;
    if (generation of ITE[itpn] successful) $R_{x,y}$=$R_{x,y}$∪{(x.k, y.itpn)};
      $ITE_y$=$ITE_y$∪{$ITE_y$[itpn]};
      itpn=itpn+1; fi
  fi
  else if (p∈$ITE_{x,y}$) & (one(y.LI[k]⊕y.TI[k])≥1) & ((_, y.k)∉$R_{x,y}$)
    Generate source test pattern of x with the #TP#=otpn such that
    one((x.LO[otpn]⊕x.TO[otpn])⊕(y.LI[k]⊕y.TI[k]))=0;
    if (generation of OTE[otpn] successful) $R_{x,y}$=$R_{x,y}$∪{(x.otpn, y.k)};
      $OTE_x$=$OTE_x$∪{$OTE_x$[opn]};
      otpn=otpn+1; fi
  fi
  $U_{x,y}$=$U_{x,y}$-u;
end 6. For each sink y, compute translation vectors from output of source x,
  1. $TV_{x,y}$=$\underline{A}$(i,j:size($OTE_{x,y}$)≤i<otpn,size($ITE_{x,y}$)≤j<itpn, (x.i, y.j)∈$R_{x,y}$:$TV_{x,y}$[x.i, y.j]=x.TO[i]⊕y.LI[i])

Generation of test patterns after composition of test patterns can be attempted to recover original inter-core test coverage of source and sink in step 5. The test pattern number function, denoted as tp_num(p), can return test pattern number of test pattern p. A number of test patterns of the OTE and the ITE are denoted as the otpn and itpn, respectively. The test pattern p=u, u∈$U_{x,y}$ denotes an element of test environment selected from union of test environments, denoted as $U_{x,y}$. If the p=u∈$OTE_{x,y}$ and contains the transition that cannot be synchronized in the $ITE_{x,y}$, denoted as (x.k, _) ∉ $R_{x,y}$, then the $ITE_y$ can be expanded in the if statement to include the test pattern that can propagate transition in the p, if possible. Similarly, the $OTE_x$ can be expanded in the else if statement, if the transition in the p∈$ITE_{x,y}$ cannot be provided from the $OTE_{x,y}$, denoted as, (_, y.k) ∉ $R_{x,y}$. After the inter-core test pattern generation, the translation vectors for the additional test patterns can be computed similarly and added to the $TV_{x,y}$ in step 6.

Structural at-Speed Testing of Memory Shadow Logic

Function of memories is to store values for future use. Its fundamental operations can include writing data to and reading it from memories. Memories can be considered as multi-dimensional arrays in which any location can be accessed by address. Operations of memories are implemented in logic gates that can form a memory interface logic. The memory interface logic is often called a shadow logic of memories or a shadow logic in short.

Modern IC devices are equipped with many embedded memories but their shadow logic is seldom tested at-speed. As a consequence, it can be difficult to confirm performance aspect of memories and their interface within system.

The aforementioned translation layer and the test environment can be applied to the testing of the shadow logic.

Figure 9:
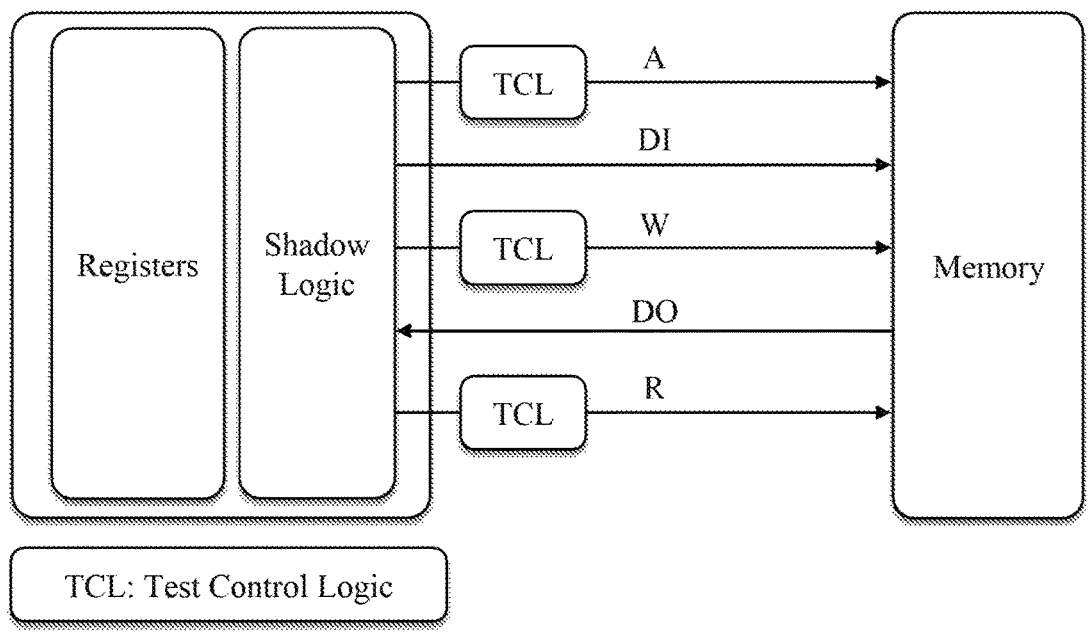
FIG. 9 is an Overview of DFT architecture for shadow logic test.

An overview of DFT architecture is shown in FIG. 9. The test control logic (TCL) can provide test access to the circuit under test. Basic idea is to transform the memory shadow logic test into the conventional structural test by considering memory as a randomly accessible 2-stage pipelined registers which can be accessed in any order. The consecutive test results of the shadow output logic can be written into random memory locations. They can be read back in any order to test the shadow input logic. The TL can be applied to recovery of the write memory addresses from randomly generated read addresses.

Figure 10:
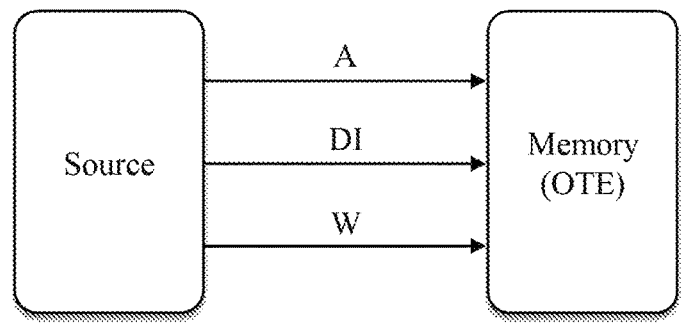
FIG. 10 is an embodiment showing Memory as test environment.
Figure 10:
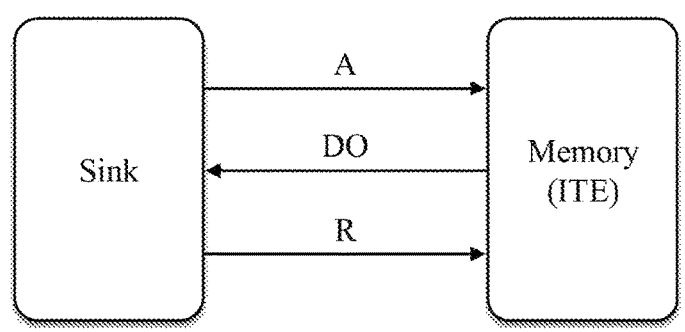

RAM can be considered as a test environment of random logic as shown in FIG. 10. For write and read operations, memories can viewed as the output test environment (OTE) of shadow logic and the input (ITE), respectively. Test patterns that are written into memories during write mode for the testing of output shadow logic can be applied to test input shadow logic during read mode.

Figure 11:
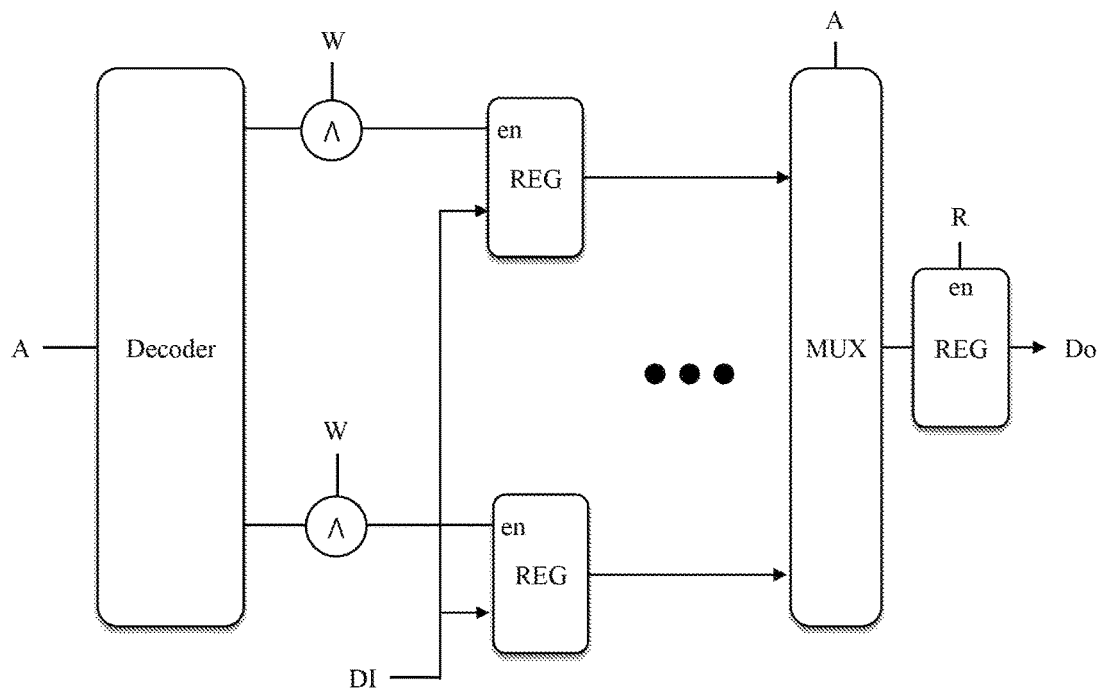
FIG. 11 is an embodiment ATPG model of memory for shadow logic test.

An example of ATPG model of memory for shadow logic test is shown in FIG. 11. The address can be decoded into a memory location. The selected memory cell represented by the register can be enabled when the write is enabled or the W=1. The memory cell can retain current data when disabled. The input data (DI) is stored into the register by the address decoder. The stored data can be retrieved when read is enable or the R=1. The output is provide the data output (DO) through the multiplexor. The DO is assumed to produce the previous read data during the write.

Multi-port memories can be viewed as multiple copies of single port for shadow logic test.

Initialization of memory content is not assumed in the scheme.

The test protocol can be expressed as (W*→R*)*, where * denotes any number of repetitions. In general, read-after-write test protocols can be applied to the testing of shadow logic. The memory write operation can ensure that the test data to be read by the read operation is defined. Each write can store a data to the same or different address. The test protocols for transition test of read-write logic can be (W→R)$^N$ and of data and address logics (W$^N$→R$^M$), where M>0 and N≥M. In the scheme, the following assumptions the write and the read control signals are assumed to be complement to each other. Examples of read-after-write test protocols can be 7. W→R, denoted as one read after write (1-RAW)
8. W→R→W→R, denoted as read after write (RAW).

9. W→W→R→(R|W), denoted as read after multiple writes (RAMW) where | denotes choice or OR. A special case of the RAMW can be W→W→R→R, denoted as two reads after two write (2RA2W)

The 1-RAW test protocol is a subsequence of the RAW and can be applied to a dynamic testing of the write logic and the read. If the write logic and the read can produce any pair of complementary logic values or transitions, the TL can translate them into the 1-RAW test protocol signal. The test result is obtained by reading the data from the same address to which the data is written.

Figure 12:
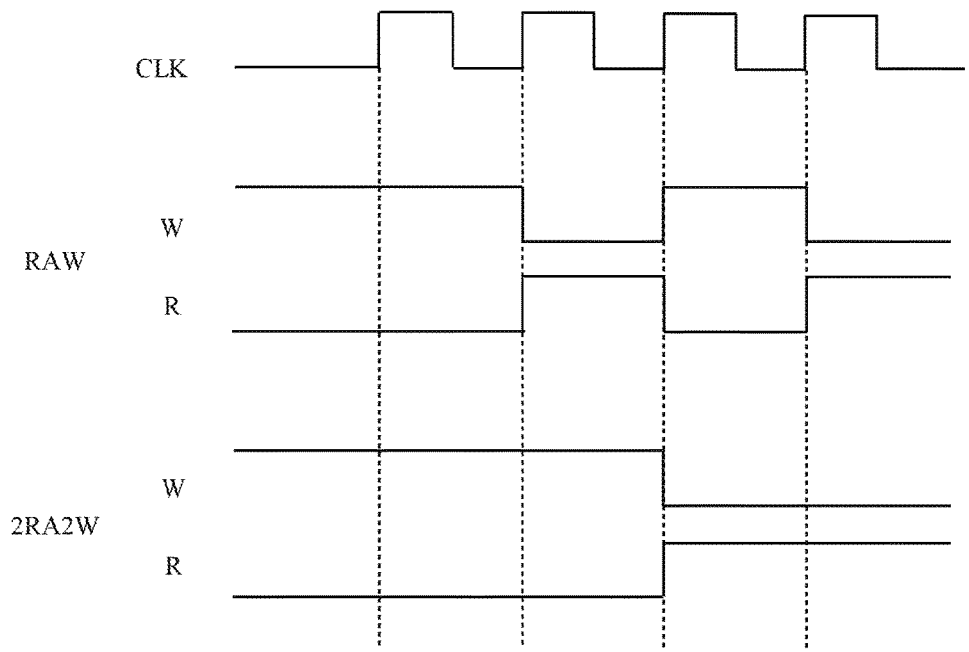
FIG. 12 is a timing diagram of the two test protocols.

Since the testing of address logic and data can require more than one write and read, the RAW and 2RA2W test protocols are employed to describe the shadow logic testing. Timing diagram of the two test protocols are shown in FIG. 12.

The RAW test can detect dynamic faults associated with read (R), write (W). Write followed by read from the same memory location can detect dynamic faults on the read logic. Read followed by write followed by read, or (R→W→R), can detect dynamic faults on the write logic and the read.

The 2RA2W test can detect dynamic faults associated address, data in (DI) and data out (DO). Writing two consecutive random data into two random addresses and reading back from the same memory locations can test dynamic faults on address logic and data logic.

Two tests can involve two random addresses and input data. Write (W), read (R), address (A) and input data for the test can be randomly generated from ATPG. The memory read-write test can be obtained by translating random data into the required using the translation layer.

The translation layer can be determined for randomly generated write, read and addresses for the test. The write and read can require the W=(1, 0, 1, 0, 1) and the R=(0, 1, 0, 1, 0) for the RAW test protocol and the W=(1, 1, 0, 0, 1) and the R=(0, 0, 1, 1, 0) for the 2RA2W. The last write is to allow the DO to be stable so that the launched transition from the DO can be captured into the system logic.

The ATPG can provide a sequential random vectors for the W and the R, denoted as W'=(W'(0), W'(1), W'(2), W'(3), W'(4)) and R'=(R'(0), R'(1), R'(2), R'(3), R'(4)), respectively, where the W'(t) and the R'(t) denote the output of write logic and the read at the i-th clock cycle. The translation layer can be determined from the required and the ATPG provided random vectors as $W_{TL} = W \oplus W'$ and $R_{TL} = R \oplus R'$ where $W \oplus W'$ and $R \oplus R'$ denote bit-wise XOR operation. The translation can ensure that transitions generated from the circuit under test are maintained or preserved in the test patterns. The translation layer can inject transitions only when no transitions is present. Similarly, the translation vector of the addresses, denoted as $A^{TL}$, can be determined as $$(0, A^{TL}_1, 0, A^{TL}_3) = (0, A^W_0 \oplus A^R_1, 0, A^W_2 \oplus A^R_3) \text{ for RAW} \quad \text{Eq. 22}$$

$$(0, 0, A^{TL}_2, A^{TL}_3) = (0, 0, A^W_0 \oplus A^R_2, A^W_1 \oplus A^R_3) \text{ for 2RA2W} \quad \text{Eq. 23}$$

where the $A^W_t$ and $A^R_t$ denote the randomly generated addresses of write and read in t-th clock cycle from the ATPG, respectively. Note that the address for the last write to keep the DO stable can be unnecessary or don't-care and is not explicitly shown. Since the data can be read back from the same memory location that the data is written to, the write addresses can be random and the translation of the addresses for write is unnecessary. The translation layer function $T(A^R_t)$ can recover the write address from the randomly generated read addresses. The recovery of the write address from the read can be summarized as $$A^R_t = T(A^R_t)$$
$$= A^{TL}_t \oplus A^R_t$$
$$= (A^W_t \oplus A^R_t) \oplus A^R_t$$
$$= A^W_t$$

The data $DI_t$ and $DI_{t+1}$ can be written to the $A^W_t$ and $A^W_{t+1}$ when W=1 and R=0. The translation layer can allow the stored data to be retrieved from the same addresses and observed at the DO when W=0 and R=1.

The sequences of (A, W/R, DI, DO) in the RAW and the 2RA2W can be as follows:

RAW: $(A_0, 1/0, DI_0, x)_0 \to (A_0, 0/1, x, DI_0)_1 \to (A_1, 1/0, DI_2, DI_0)_2 \to (A_1, 0/1, x, DI_2)_3$.

2RA2W: $(A_0, 1/0, DI_0, x)_0 \to (A_1, 1/0, DI_1, x)_1 \to (A_0, 0/1, x, DI_1)_2 \to (A_1, 0/1, x, DI_0)_3$

Dynamic faults of the write logic and the read can be detected by the following transitions.

1. RAW: $(R, DI_0) \to (W, DI_1) \to (R, DI_1)$
2. 2RA2W: $(W, DI_1) \to (R, DI_1)$

The write and the read can be paired with the DI and the DO, or (W, DI) and (R, DO), respectively. The (R, DO=$DI_k$) and (W, DI=$DI_k$), or simply (R, $DI_k$) and (W, $DI_k$), denote reading of data $DI_k$ at the memory output DO and writing of data $DI_k$ into a memory through the memory input DI.

Test control logic (TCL) can be programmed to implement the shadow logic test. The test patterns of shadow logic can be enabled when the TM=1 and MTM=0. The MTM (memory test mode) can enable a memory BIST (MBIST) test, when the MTM=1.

Figure 13:
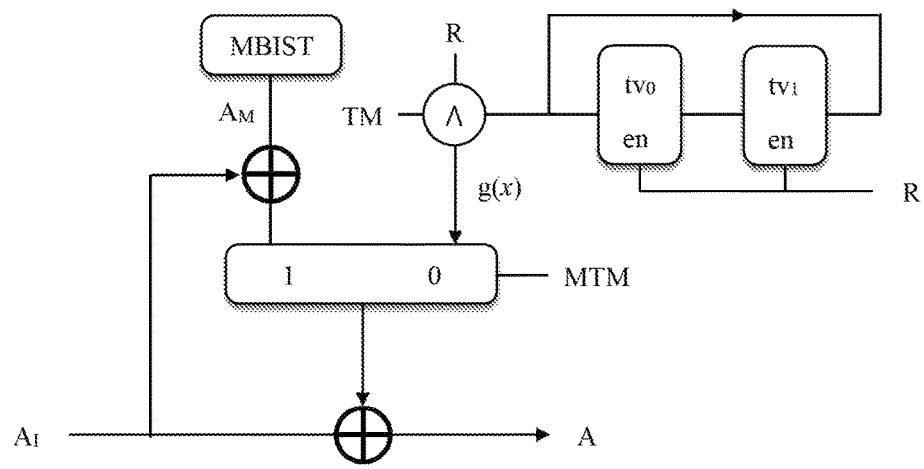
FIG. 13 is an embodiment of address translation layer control logic.

An address translation layer control logic is shown in FIG. 13. The address translation control logic can translate the input address $A_1$ to the output address A. If the R=0, the translation can be disabled. The two translation vector registers of size($A_1$) bits can be disabled and the translation vector g(x)=0. Hence, the output address A can be the same as the input $A_1$, or the A=$A_1$. Otherwise, the address A=$A_1 \oplus$g (x), where the g(x) contains the translation vector for address the data to be written. The $tv_0$ and the $tv_1$ denote registers that contain the translation vectors of size($A_1$) for the first and the second addresses from which the output data can be obtained.

Figure 14:
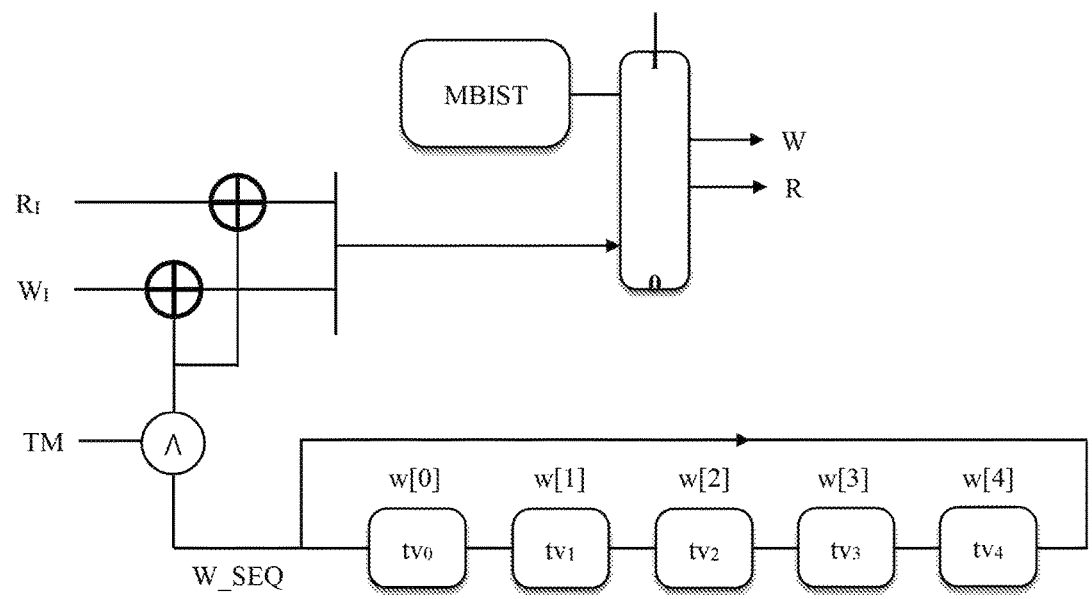
FIG. 14 is an embodiment of Test control logic of the write (read).

Test control logic of the write (read) is shown in FIG. 14. Similarly, the translation vector registers are of a single bit in case of the read logic and the write. The required translation vectors can be provided in a circular shift register. The five-bit translation vectors can be calculated from the five-bit randomly generated write and read in the ATPG. The corresponding five bit sequential values to implement the RAW and 2RA2W test protocols are provided in Table 5.

TABLE 5

| | RAW | 2RA2W |
|---|---|---|
| Write | 1 → 0 → 1 → 0 → 1 | 1 → 1 → 0 → 0 → 1 |
| Read | 0 → 1 → 1 → 0 | 0 → 0 → 1 → 1 → 0 |

Let (t: 0≤t≤4: w(t)) and (t: 0≤t≤4: r(t)) be translation vectors for the write and read, respectively. The symbol t denotes a t-th clock period. The translation vectors can be specified as 1. RAW: $(\neg W_f(0), W_f(1), \neg W_f(2), W_f(3), \neg W_f(4))$ and $(R_f(0), \neg R_f(1), R_f(2), \neg R_f(3), R_f(4))$
2. 2RA2W: $(\neg W_f(0), \neg W_f(1), W_f(2), W_f(3), \neg W_f(4))$ and $(R_f(0), \neg R_fM, R_f(2), \neg R_f(3), R_f(2))$ where the symbol $\neg$ denotes logical negation or NOT operator and the $W_f(t)$ and RI(t) denote the outputs of the write and the read logics at t-th clock period, respectively.

The (t: 0<t<4: w(t) or r(t)) can be obtained from sequential ATPG of depth 4.

The rising transition of the write, denoted as $W\downarrow$, can be tested in presence of falling transition of the read, denoted as $R\downarrow$, by showing that memories can be written within a cycle.

Similarly, the $R\uparrow$ can be tested in presence of the $W\downarrow$ by showing that memories can be read within a cycle.

Sequential ATPG burden can be mitigated by reducing a size of circuit under test for the ATPG. Circuit under test can be limited, partitioned or abstracted for the shadow logic test.

Test procedure of shadow logic can be summarized as:
1. Generate structural test patterns of the required sequential depth for targeted shadow logic without considering memory operations.
   a. The sequential depth, for example, can be four for the RAW and the 2RA2W.
   b. Determine or compute translation vectors (t: 0≤t≤4: w(t)) and (t: 0≤t≤4: r(t)) in each sequential depth from a state of shadow logic for a targeted test.
2. Load translation vectors during scan load/unload.
3. Execute the test.
4. Observe the test result captured in output data logic for test decision.
5. Repeat steps 3-4 until all test patterns are exercised.

Figure 15:
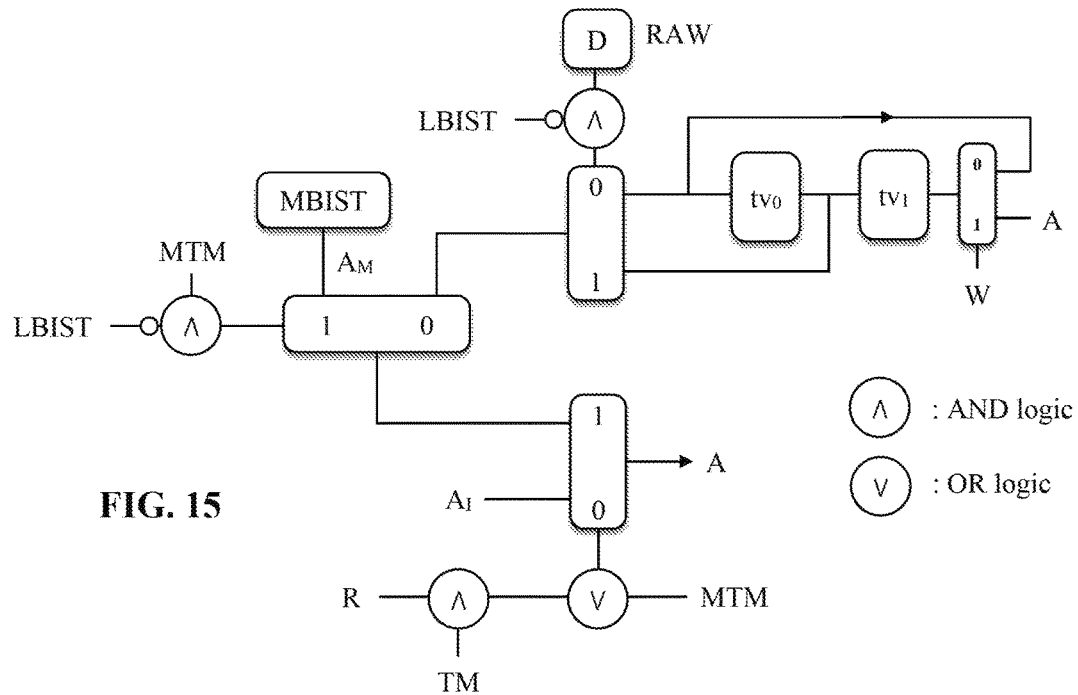
FIG. 15 is an embodiment of Address translation layer control logic for LBIST.
Figure 16:
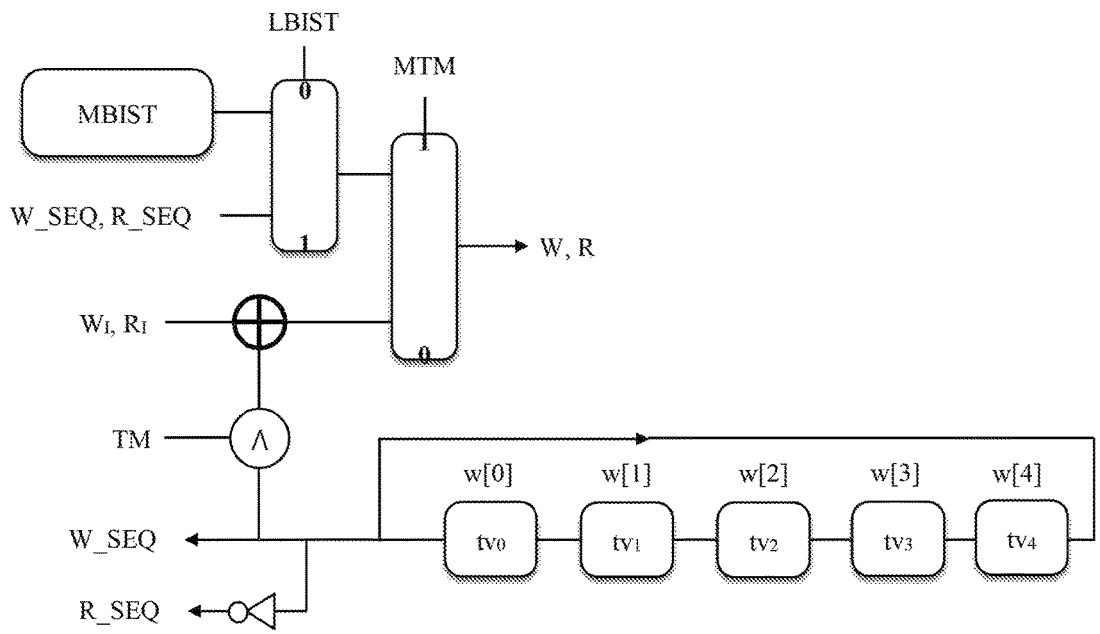
FIG. 16 is an embodiment of Write-Read test control logic for LBIST.

The test control logic can be extended for logic built-in self-test (LBIST). In the LBIST scheme, the test can be performed during the write, or W=1 and R=0, and the test result can be observed during the read, or W=0 and R=1. The test control logic of the address logic shown in FIG. 15, the addresses of which data are written can be saved in the circular shift register during the write and used for read. The write and read signal can be directly provided from the test control logic of the write and read logics, as shown in FIG. 16.

Test Sequence Specification (TSS)

Aim of test sequence specification (TSS) is to specify order of test execution to achieve 100% test pattern utilization. An ordered core tests is called a test sequence (TS). The TSS can specify a set of test sequences that can be carried out continuously until all of the specified tests are completed. The TSS can be realized by test sequencer (TSR). Test sequencer can implement or carry out all possible test sequences specified in the TSS. The test sequencer can interact with cores to implement the specified test sequence. The TSR can enable multiple core tests that can be performed in parallel to reduce test time. Which test sequence to be performed can be programmed into the TSR. With an aid of the translation layer, test sequencer can provide test sequences that can achieve 100% test pattern utilization.

Figure 17:
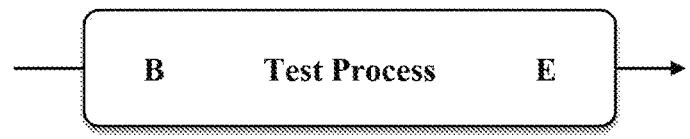
FIG. 17 illustrates a test procedure can be encapsulated in Begin (B) and End (E).
Figure 17:
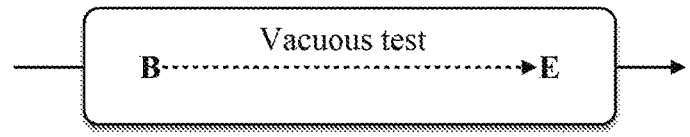

A test can be considered as a process which can contain a test procedure. Test procedure can be encapsulated in Begin (B) and End (E), as shown in FIG. 17. Test process can be expressed as Test_Proc=B→Test_Procedure→E. Test procedure can specify a detailed description of the test. Test process, for example, can include power-on sequence as a part of the test. Test procedure can be initiated when Begin signal is received and terminated when test procedure is completed. Completion of test procedure is indicated by End. End can trigger Begin of other test processes. For example, test process of structural at-speed core test, denoted as Proc0, can be specified as Proc0=B→Launch→Capture→E. Test process can be vacuous, if test procedure is disabled or no test procedure specified in test process. In the vacuous test process, Begin can directly cause End. The vacuous test process is denoted as $T_\varnothing$=B→skip→E.

The test procedure can synchronize with the TSR through Begin and End. The test procedure can be initiated when Begin is asserted and can assert End when the test procedure is completed. The built-in self-test (BIST) schemes commonly have a BIST-go mechanism to initiate the BIST test engine and a BIST-done to indicate the end of the test. For example, memory BIST process, or MBIST, can be expressed as MBIST=B→MBIST_proc→E
MBIST_proc=BIST_go→MBIST_test→BIST_done The BIST_go and BIST_done signals can coincide with the Begin and End.

Figure 18:
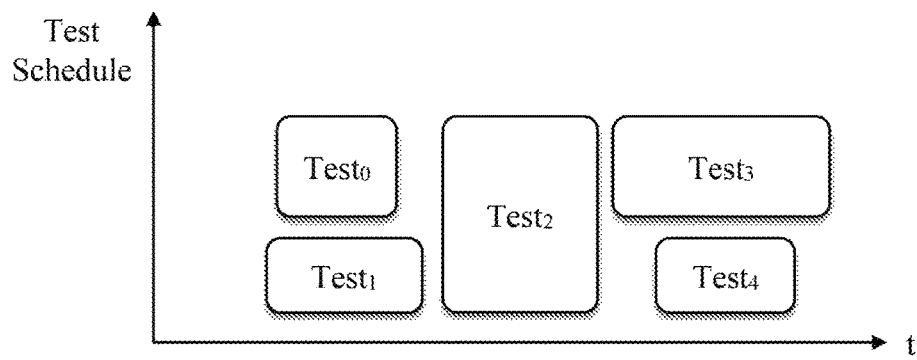
FIG. 18 is an example of test process composition.
Figure 18:
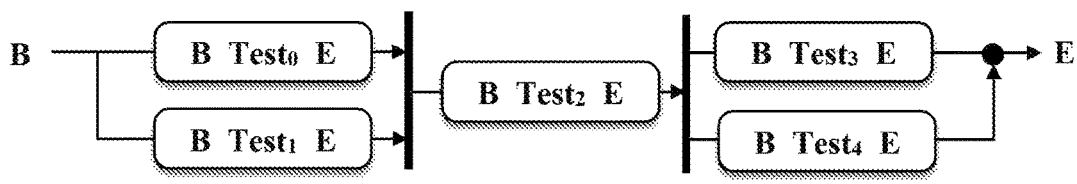

Test processes can be composed with respect to Begin and End. As example shown in FIG. 18, test schedule of various tests with respect to their test time and constraint can be specified in test processes. Test process can enclose a test procedure and enable any core test can interact with the test sequencer via a handshake protocol. Beginning of the test can be triggered by the test sequencer and end of the test can be provided to the test sequencer. Any test that does not conform to the handshake protocol can be transformed into the one that can by adaption of a timer. The timer can keep track of beginning to end. The time can be enabled when the test starts and produce the done signal when time-out is reached.

Figure 19:
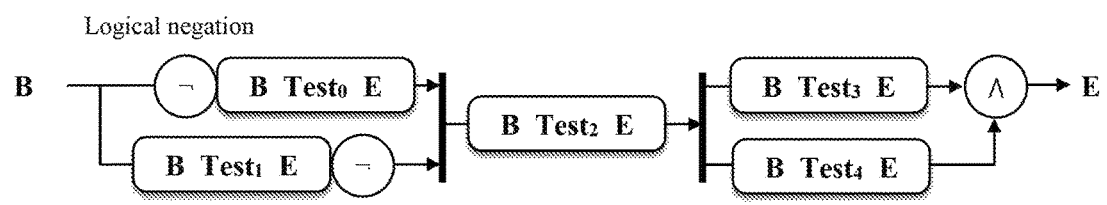
FIG. 19 is a refinement of test process composition.
Figure 19:
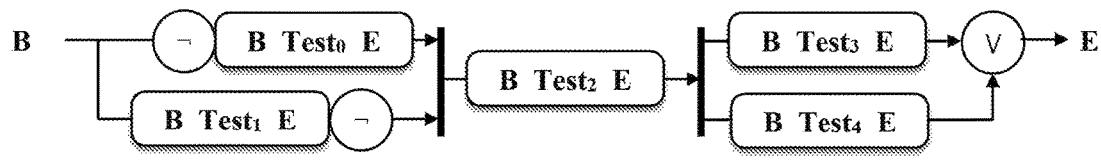

Test processes, as example shown in FIG. 19, can be composed to form a more sophisticated test process. The composed test process can be specified as $Test_C$= (Test$_0$|Test$_1$); Test$_2$; (Test$_3$||Test$_4$), where the symbols || and; denote parallel and sequential compositions, respectively. Composition of test processes can be achieved via synchronization of Begin and End. For sequential composition of the test processes Proc1 and Proc2, or Proc1; Proc2, End of Proc1 can be synchronized to Begin of Proc2. Hence, Begin of Proc2 can be triggered by End of Proc1. Parallel composition of Proc1 and Proc2, or Proc1||Proc2, can be achieved by synchronization of Begins and Ends of both Proc1 and Proc2.

Synchronization of Begins can be achieved by a fork that can spawn multiple Begins from a single Begin, with an assumption that delay difference between branches are negligible within a clock period under consideration. Synchronization of the End events, as shown in FIG. 19, can be implemented by joining multiple Ends with logical AND ($\wedge$) or OR ($\vee$). If AND or OR can be employed in synchronization of the Ends, the synchronized End of the composed test process can be dependent on the latest or the earliest End asserted by one of joined test processes, respectively. In the example, the latest or earliest arrival of End of Test$_3$ or Test$_4$ can determine End of the composed test process, if the $\wedge$ or $\vee$ were employed, respectively. Communication or synchronization among the parallel test processes be achieved through channel. Any input or output action on the same channel in test procedure can result in communication or synchronization.

Logical negation of Begin, denoted as ¬Begin, can be introduced to specify initial test processes in test sequence. Initial test process can be defined as the first test to be performed in test sequence. ¬Begin can be asserted in the initial test process to start test execution when test sequencer is enabled. There can be multiple initial test processes in composed test process. Similarly, logical negation of End, or ¬End, can be introduced to alter or reconfigure synchronization constraint of End. Assertion of ¬End can nullify synchronization of END in a composed test process. In parallel composition, for example, ¬End can disable corresponding synchronization constraint in the parallel End so that END of the corresponding test process needs not be considered. A set of all configuration of ¬Begin and ¬End specified in the test TSS is denoted as a configuration of test sequencer. The test sequencer configuration can determine test sequences to be carried out by the test sequencer.

Both ¬Begin and ¬End can be implemented by XOR logic or OR depending on test applications. Using XOR, for example, the new Begin can be expressed as Begin⊕NOT, where NOT denotes control input for inversion. If NOT=1, for example, Begin can be inverted, or ¬Begin, and otherwise, Begin can be unchanged. NOT can be set to logic 1 in initial test processes. XOR implementation of ¬Begin and ¬End, however, can lead to the dynamic test sequencer configuration which can be unnecessary for structural tests. Implementation of ¬Begin and ¬End using the XOR logic, for example, can allow them to change after test execution when Begin and End change. Thus, OR implementation of ¬Begin and ¬End is employed for the structural tests to maintain the static test sequencer configuration that doesn't change the signal states of ¬Begin and ¬End during the test.

For structural tests, each test process can represent the test of each core or clock domain. The test processes with no interference or no communication constraints are assumed in parallel composition. Non-interfering test process can be obtained from commonly known graph coloring methods. In graph coloring methods, non-interfering test processes can correspond to nodes that are assigned with the same color.

Figure 20A:
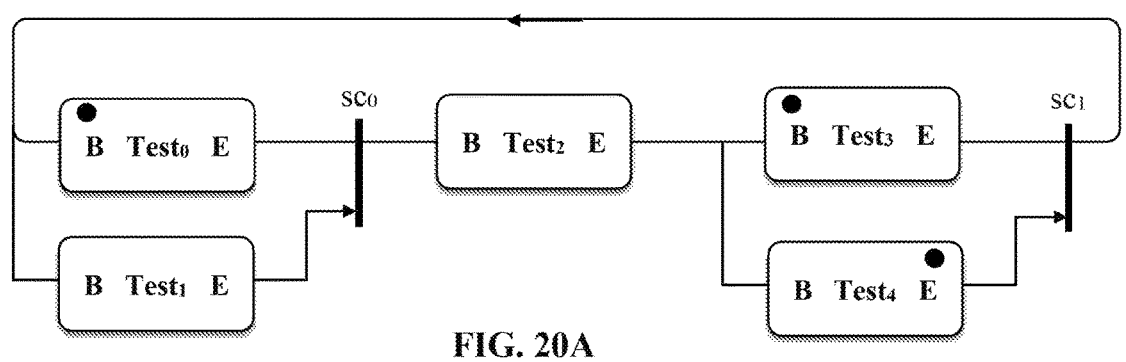
FIG. 20A is an embodiment of a Test sequencer.

System test can be represented by composed test process that can be specified by the TSS. Test sequencer can be configured to provide specified test sequences. Test sequencer can initiate initial test processes and continue execution of test sequence until completion. Test sequencer, as example shown in FIG. 20A, can be obtained from the composed test processes by addition of the test sequencer configuration and a feedback from End to Begin. The feedback combined with the test sequencer configuration can increase a number of test sequences that it can implement. ¬Begin and ¬End are marked with filled dots on the top of B and E, respectively.

Figure 20B:
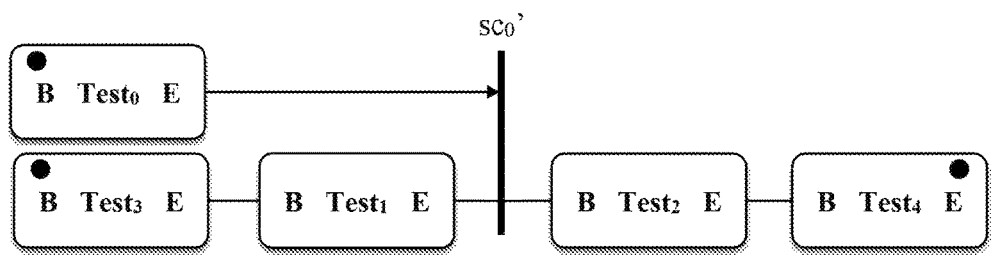
FIG. 20B is an example of the corresponding test sequences for FIG. 20A.

The test sequencer configuration comprise selection of initial test processes and reconfiguration of End constraints. A set of specified initial test processes can select a test sequence from a set of all possible test sequences. Example of the test sequence selected by the set of initial tests (Test$_0$, Test$_3$) and reconfiguration in {Test$_4$} is shown in FIG. 20B. Note that the synchronization constraint denoted as sc$_0$' is reconfigured by End of Test$_4$. A set of test sequences enabled in the test sequencer, denoted as TSEQ, can be TSEQ=(Test$_0$∥Test$_3$; Test$_1$)); Test$_2$; Test$_4$ When the test sequencer is enabled, Test$_0$ Test$_3$ can be initiated in parallel. Test$_1$ has to wait for completion of Test$_3$. Test$_2$ can be initiated after Test$_1$ and Test$_0$. Completion of Test$_2$ can cause initiation of Test$_4$ which can terminate the TSEQ at its completion. Note that TSEQ can be a set of test sequences that produce the same outcome. Choice of which test sequence to be performed is up to system under test.

Figure 21:
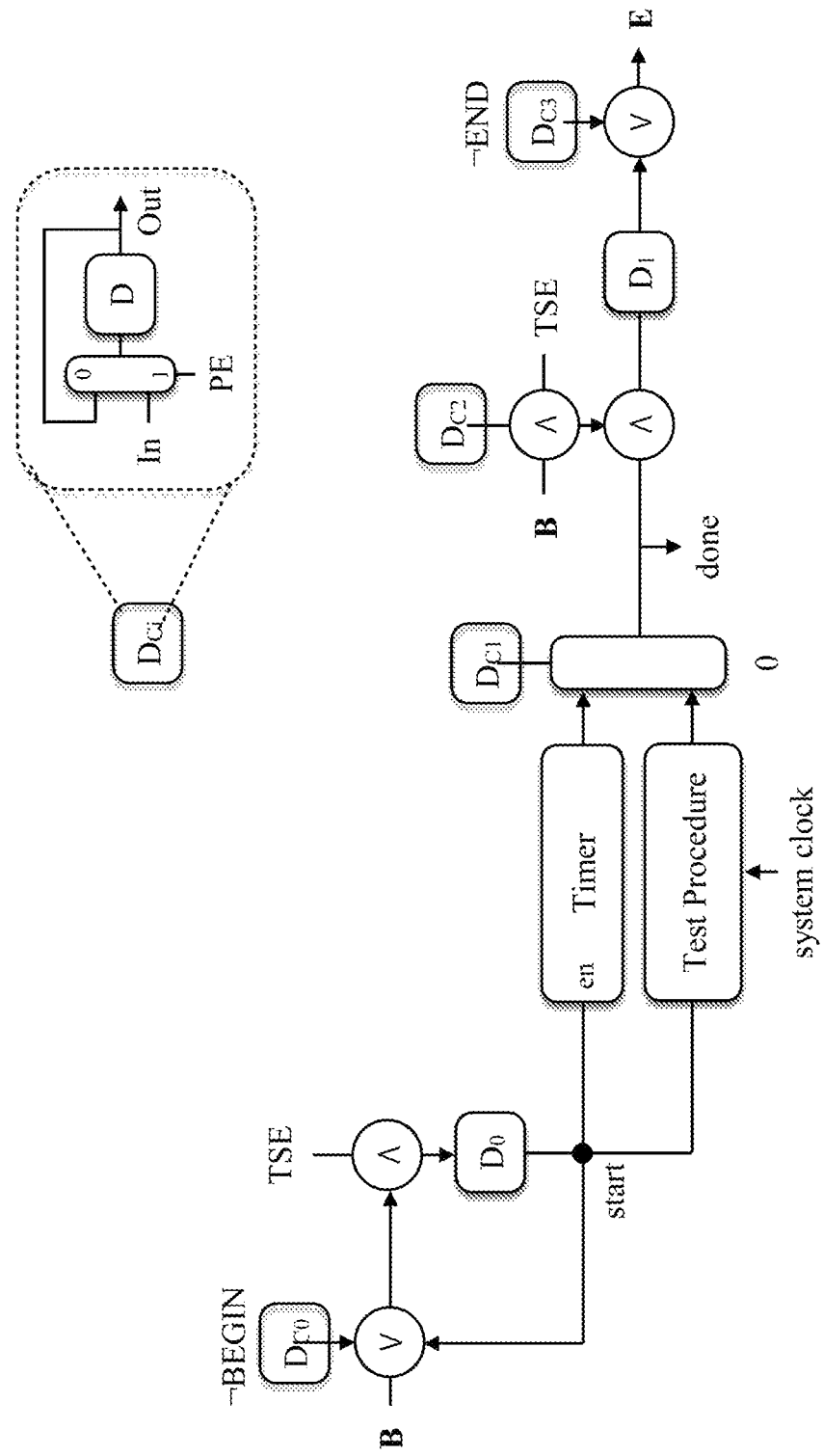
FIG. 21 is an embodiment of a Test process wrapper.

The test process wrapper that can allow implementation of test process from test procedure is shown in FIG. 21. Test process wrapper (TPW) can provide test interface between test sequencer and core test procedure. The TPW can manage synchronization between test sequencer and core test. It can also provide a programming interface for the test sequencer configuration. The test sequencer configuration can be programmed in the storage cells marked as ¬BEGIN and ¬END. The TPW can be enabled or reset when the test sequencer enable (TSE) signal is asserted or reset to logic 0, respectively. The TSE can enable synchronization ports, Begin and End, so that core test can be administered by test sequencer. The TPW can be synchronized external clock, denoted as TCK, and core test with system clock. The TPW can encapsulate the test procedure with the Begin-End interface logic. The test sequencer can asynchronously interact with the cores through their Begin-End interface logic for test execution. The Begin-End interface logic can provide a start signal to initiate a test based on Begin received from test sequencer or asserted from ¬BEGIN. The done signal received from core after completion of test can be sent to test sequencer for continued execution of core tests. End can be provided to test sequencer based on the done signal or ¬END. A timer can be incorporated into the TPW for generation of the done signal or end of test procedure for the cores that are not equipped to indicate completion of test. The timer can be bypassed with a wire or a shift register for desired latency. The bypass wire or shift register can isolate core during the testing of the TPW. When the TPW is enabled or the TSE=1, the Begin (B) or its negation can be propagated to initiate test procedure and the timer. At the end of the test procedure or the time-out, the done signal can be generated to indicate completion of the test.

Figure 22:
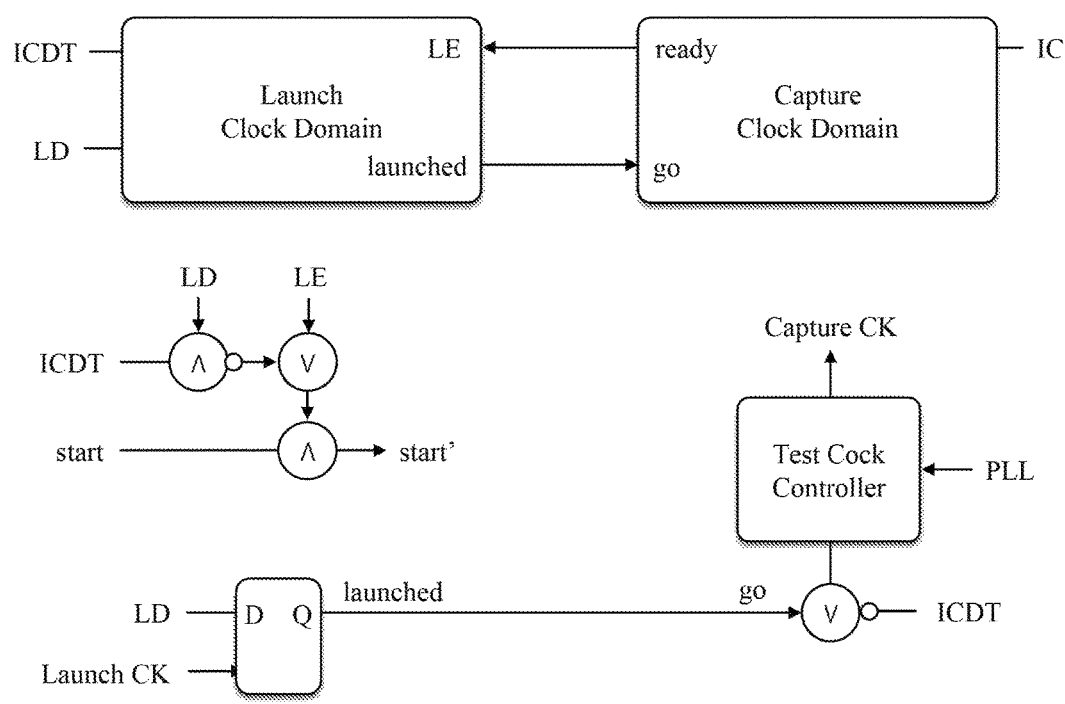
FIG. 22 illustrates an Inter-clock domain test (ICDT) interface

The test process wrapper can contain storage cells or flip-flops to implement the test control. Some registers can contain control information which can be unchanged throughout the test. Such registers are called non-volatile storage cells and denoted as $D_{Cj}$ for $0 \leq j \leq 4$. Functional view of non-volatile storage cell is shown in FIG. 22. Non-volatile storage cell can be programmed when the programming enable (PE) signal is asserted and can remain unchanged when the PE=0. Non-volatile storage cells can be initialized for test execution in the beginning of the test via the scan load/unload. In such case, the PE can be provided from the scan enable (SE). All storage cells except the non-volatile cells can be reset when the TSE=0.

Initial value of ¬BEGIN can be programmed in the $D_{C0}$ for initial test processes. When the TSE=1, the Begin from the test sequencer or the assigned value of ¬BEGIN can enable the start signal for both core test procedure and timer. The start signal can be captured into the storage element $D_0$ and remain unchanged until the TSE=0. The OR logic is used to combine Begin with ¬BEGIN, as discussed earlier. The start signal can be provided to core and timer from output of the $D_0$. When the $D_0$=1, the core test and the timer can be enabled by the start signal. After test execution, the done signal can be provided to the TPW by the core or the timer depending on content of the $D_{C1}$. The vacuous test can be implemented by the core bypass or through the timer by specifying zero time or longer latency. If the vacuous test process to be implemented, for example, the $D_{C1}$ can determine a source of the done signal. If timer were not incorporated, the done signal of vacuous test can be generated from the bypass wire or shift register mentioned earlier.

Similarly, the storage cell $D_{C2}$ can be programmed to delay propagation or generation of the done signal, respectively. The $D_{C2}$ can hold the done signal until Begin is asserted. The done signal of initial test process, for example, can be held until the Begin signal is asserted at the input of the test process. Delay of the done can offer test control flexibility to avoid interference in test execution of the parallel test processes. The storage cell $D_1$ can introduce extra delay to capture input of the translation layer after completion of the test. The introduced extra delay can aid to preserve test coverage of the cores that provide input to core under test, as mentioned previously. The $D_{C3}$ can provide the control input to assert ¬END for the test process. The ¬END can also be employed in flow control or used to disable synchronization constraint in the parallel composition of test processes.

For the core test to interact with the test sequencer through the Begin-End interface, the start and done can be incorporated into or extract from the core test hardware. Built-in self-test (BIST) test hardware, for example, is often equipped with a BIST run and BIST done which can be used as the start signal and done, respectively. For the most commonly used test clock controller employed in the structural tests, the start signal can be taken from the signal that enables the controller and the done from the final state of the controller after the test is completed. The scan enable (SE), for example, is commonly used to enable the clock controller for test and zero state of the controller to indicate the done.

Cores or clock domains can interact within a test process. Examples of such tests can be inter-core and inter-clock domain tests. In those tests, transitions launched from one core or clock domain are required to be captured by others within a specified time interval. In other word, synchronization of launch and capture are required for the inter-core or inter-clock domain test to function. Since their synchronization requirement is similar, the synchronization method is discussed in context of the inter-clock domain test. The synchronization scheme for inter-clock domain tests is shown in FIG. 22. The capture domain can first setup prepares for capture prior to synchronization. When the capture domain is ready for capture, it can initiate synchronization by sending ready-for-test signal to the launch clock domain. If the launch domain detects the ready-for-test signal, it can launch the transition and, at the same time, send the launched signal to the capture domain to enable execution of capture. The launched signal that is synchronized with the capture domain can cause capture of test response which can be used for test decision. Without loss of generality, each clock domain test also can be considered a test process. The inter-clock domain test (ICDT) and the launch domain (LD) signals can be decoded from test mode. When both the launch and capture test processes are started regardless of the order, the launch test process can wait until the ready signal from the capture process is asserted. The ready signal can enable the LE (launch enable) and allow initiation of launch test by passing the start signal. The start signal can enable launch of transition and generate the "launched" signal from the LD signal. The start signal can be asynchronous to the launch clock domain. The launched signal can propagated to the capture domain and enable generation of capture clock which can be produced from on-chip test clock controller. The launched signal is assumed to be synchronous to the capture domain. The assumption can be justified in context of the target test.

Test Distribution Network (TDN)

Aim of the test distribution network (TDN) is to provide a fast and a flexible test data delivery scheme that requires a low peak power. The TDN together with the test sequencer can form the DFT scheme. The test data can be delivered via the TDN and the test execution can be carried out autonomously by the test sequencer according to the specified test sequence.

The DFT scheme can optimize a peak power, test control scheme and test hardware resource. The TDN can ensure that no two cores are engaging in scan shift at the same time. Thus, the peak power can be limited to the peak power of a core. The TDN can locally infer the scan enable (SE) and the scan clock for each core. There is no need to explicitly provide the global SE and the scan clock for all cores. The duplex scan IO scheme can also provide an increased number of scan IOs for advanced DFT techniques such as a test compression. The increased number of scan IOs, for example, can boost a test compression ratio that can reduce test cost in terms of test time and test data volume.

The TDN can comprise the interconnected test distribution elements (TDEs). The TDE can also provide a modular test interface for a sub-chip or a core. The linearly connected TDEs is employed to describe the method in this document. The linear array can be one of the simplest form in terms of management of test control and test resource. A different routing topology such as tree, however, can be employed to provide a different set of benefits at an expanse of hardware resource and test control. The TDN including the TDE can be configured prior to the test.

The example shown in FIG. 23 illustrates the TDEs interconnected in a linear fashion. The TDE can function as an interface in which a sub-chip or a core can be plugged. The TDE can provide local test control signals that are required to carry out the structural tests. The TDE can interact with the core under test based on the test protocol signals and does not require insertion of extra test hardware in the core. The method can uniformly provide test service to both internal and external IPs. Inclusion or exclusion of any core can be managed by the TDE for test delivery and does not affect system test function that the TDN can implement. The system test can function even if some of cores are unavailable for verification or excluded in silicon debug or manufacturing test.

Figure 23A:
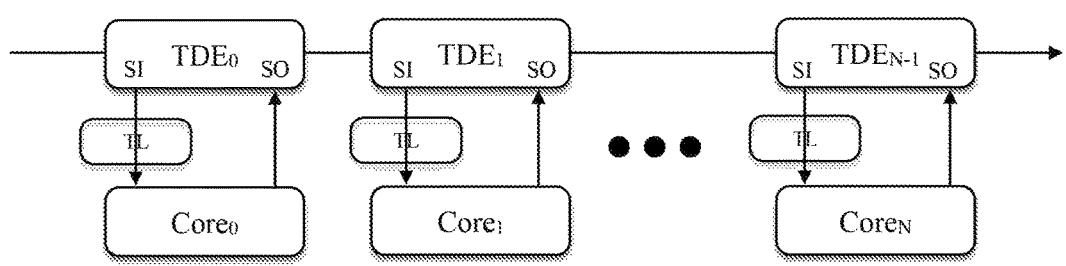
FIG. 23A illustrates the Test Distribution Elements interconnected in a linear fashion in a dedicated SIO.
Figure 23B:
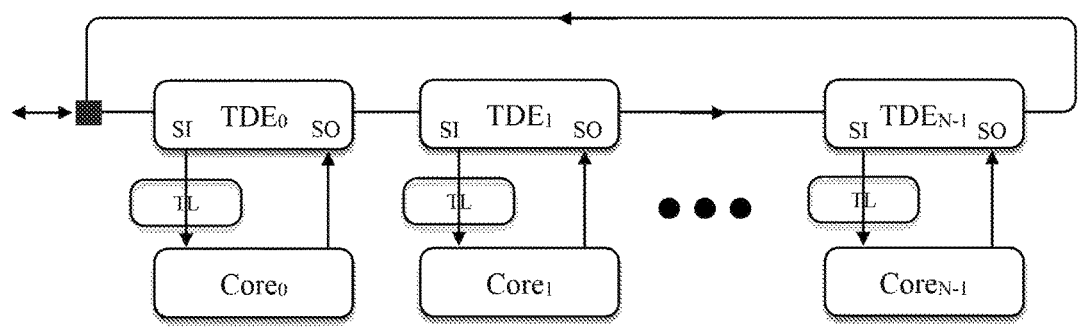
FIG. 23B illustrates the Test Distribution Elements interconnected in a linear fashion in a half-duplex SIO.

The translation layer (TL) discussed previously can be introduced in the core or outside between the TDE and the core. The scheme assumes that the translation layers are incorporated outside of the core for the purpose of discussion. As shown in FIGS. 23A and 23B, the scan chains of the translation layers can be appended to the core scan chains. The translation layers can provide the test environment for cores under test when other cores are unavailable or excluded from the test. Outputs of turned-off cores can be fixed to a predefined value, called an off-value. The off-value of core can be any constrained logic value discussed in FIG. 3A or 3B or the output value in reset state. The off-value of source can allow input of sink to be provided from the TL during test execution of the sink. Alternatively, the enabled core inputs can be similarly blocked as the blocked output and the test input can be provided from the TL. The output of the enabled core can be observed via the observability register mentioned previously. Since introduction of the off-value through the functional reset state can be least intrusive with respect system performance, the off-value from a reset state is assumed in the scheme. The test reset signal can be locally provided by the TDE. When the test reset is asserted, the output of the corresponding core is assumed to be determined.

The TDN combined with the test sequencer introduced earlier can form the test platform for the system under test. The TDN and the test sequencer can engage in the test data delivery and test execution, respectively. The TDN can communicate end of test data delivery to the test sequencer for synchronization of test execution.

The TDN can be configured into a dedicated IO or a half-duplexed as shown in FIGS. 23A and 23B, respectively. The half-duplex IO can engage in either input or output and not both at the same time. The half-duplex IO can double the number of available IO for test delivery and can be utilized in various DFT techniques to reduce test data volume and test time.

The method can allow test patterns to be delivered only to the cores under test. That is, test patterns do not need to include filler test data for the turned-off cores or for the cores that are not participating in the test. The test data distribution protocol can allow test data to be delivered only to those cores that are enabled for the test. If, for example, any six out of ten cores are excluded for test, a stream of the test data sent via the TDN can contain the test data for those six cores without filler test data for the excluded cores.

Figure 24:
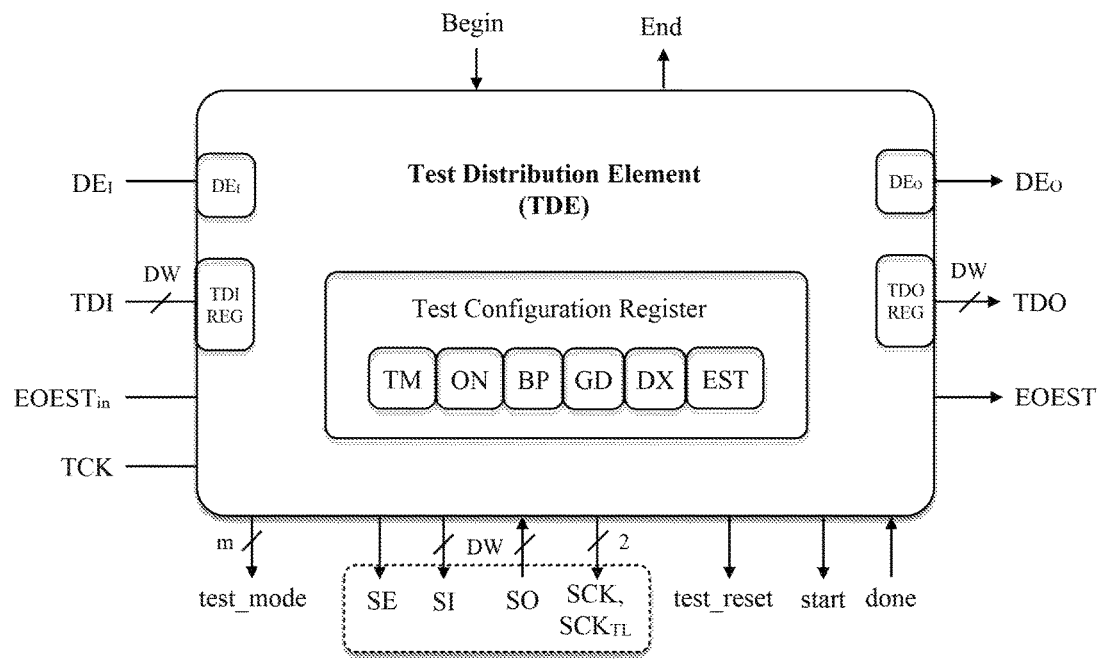
FIG. 24 is an embodiment of a Test distribution element.

Test distribution element (TDE) is shown in FIG. 24. The TDE can circulate test data tagged with a data enable (DE) signal. The DE can indicate whether the accompanying test data is valid test input or not. The DE can also function as a control bus from which test control sequences can be provided for test data delivery and test execution. The control sequences can be incorporated into the TDN test protocol which can comprise test data distribution protocol and test execution protocol. The test data distribution and the test execution protocols can specify how test data are to be distributed and how test should be initiated and ended, respectively. The TDN test protocol is discussed in detail later. The test data can be received in the test data input (TDI). Data width of the TDN is denoted as the DW. There can be multiple TDNs in the system under test, depending on partition of test delivery and test execution.

The received test data can be delivered to the core or passed to the neighboring TDE through the TDO. Similarly, the corresponding DE can be stored in the $DE_I$ and $DE_O$ storage cells, respectively. The TDE can provide scan protocol signals for each core. The scan protocol signals can include scan enable (SE), scan clock (SCK), scan input (SI) and scan output (SO). The SE and the SCK can be local to each core. The local SE and SCK can be inferred from the test distribution protocol provided from the DE within each TDE. The test sequencer enable (TSE) can also be inferred locally from the control sequence provided through the DE. The test sequencer can perform autonomous test execution of cores under test by handshaking through the Being and the End signals of each TDE according to the test sequence programmed in the test sequencer. Assertion of the TSE after end of test delivery in each TDE can enable the Begin and the initial test ¬Begin to cause the start signal to initiate the core test. The Begin signal can be provided by the test sequencer and the initial marking ¬Begin can be programmed in the TDE prior to test execution. The start signal can be issued to the core from the TDE and the done signal can be provided to the TDE from the core, when the test execution is completed. The done signal can cause the End signal to indicate completion of the core test. The End signal is provided to the test sequencer and can cause to initiate other outstanding tests. Note that the done signal can also be generated in the TDE by the timer, if the core is not equipped to provide it.

Test configuration signals can be provided from the test configuration register. The test control signals can include test mode, on-off control of the core test, bypass, selection of test distribution method, scan IO configuration and an external sequential test mode. The configuration register can be local and allow each core to implement a different test scenario or mode from the rest of the cores. Some of cores, for example, can engaged in stuck-at structural test while others in at-speed test.

The test mode can be a multi-bit signal and specify type of test that the TDE is to service. The detailed configuration signals can be provided from the test mode for selection of test, clock source, test compression and other necessary test control signals. Test mode, for example, can provide test configuration of at-speed inter-clock domain test using internal clocks with test compression.

The ON control is a single bit switch to enable or disable the core for the test delivery and test execution. If the ON control is reset (to logic 0) during test delivery, the TDE can disable the SCK of the core and hence, no test delivery can be performed for the core. If the core were turned off during the test execution, the corresponding core test can be vacuous. The start signal can be bypassed to the done in the vacuous test execution. The ON control can assert the local test reset signal denoted as test_reset, when it is turned off.

The output of turned-off core can be fixed so that the input of its sink core can be solely determined by the translation layer (TL). Since the output of turned-off core can be forced to its off-value, the input of sink can be directly provided from the TL. This can allow verification and testing of system under test to be performed regardless of exclusion and inclusion of any particular set of cores. The TL of the turned-off sink cores can be used to capture the output of its source cores. The TL can provide efficient test access to the test and the silicon debug, regardless of cores are enabled or disabled.

The bypass (BP) can allow the test data to be bypassed from the TDI directly to the TDO. The BP can bypass both the TL and the core scan chains, when the BP=1. The bypassed core scan chains can be turned on for the peak power test. They, for example, can be turned on to increase the peak power or worsen test environment for other cores under test. The TDE is called enabled if the BP=0 and disabled, otherwise.

The test data delivery method can be configured as a fair distribution (FD) method or a greedy distribution (GD). In the FD approach, test data can be equally distributed to each core one test data at a time. In the GD, however, entire test data can be delivered to a core before they are delivered to other cores. The GD can be considered as a prioritized distribution where priority can be determined by the order that they appear in the TDN. The core with the highest priority, for example, can be the first one that can receive the test data or the closest to primary input of test data in the TDN. The distribution method can be specified in the GD control bit. The GD method and the FD can be enabled if the GD=1 and 0, respectively.

The TDN can be designed for high-speed to expedite test data delivery in the FD. The test data can be delivered to the TDEs at a high speed. Transfer of the delivered test data from the TDEs to the cores, however, can be performed at a slow speed. The test data transfer can be performed at a frequency of f/M, where the f denotes a frequency of test clock at which the test data can be moved through the TDN and the M a number of enabled cores in the linearly connected TDEs. The test data transfer can be ordered in the same way to reduce the peak power. The input test data can be consumed by the first core that receives it. The input test data tagged with the $DE_1=1$, denoted as valid test data, can be provided to the TDI for consumption. The TDE can consume the valid test data to load scan chains that it is servicing. The valid test data can be consumed only once and become invalid if consumed. When the test data is loaded into the scan chains, the TDE can unload the scan output to the TDO and reset the $DE_O$ so that the scan output is not used by any other cores for scan input. The test response captured in the scan output can be propagated to output of the TDN for test decision.

The scan IO can be dedicated or half-duplexed. Separate scan input and output can be employed in the dedicated scan IO configuration, whereas they are shared in the half-duplexed. The required scan configuration can be specified in the DX control bit. If the DX=1, the half-duplex scan IO can be configured and the input test data and the output can be sent and received via the same scan IO pin, respectively.

The external sequential test (EST) can specify sequential test using external clock or the SCK. The EST can be performed after test delivery and prior to the test execution by the test sequencer. Its purpose is to put the core into a required state before execution of the at-speed test. At the end of the EST, the TDE can output the end of EST, or EOEST. If the EST were scheduled for multiple cores, the EST can be initiated when the end of EST (EOEST) is received from the TDE that was scheduled earlier. The received EOEST is denoted as a $EOEST_{in}$. The EOEST can be serially connected from one TDE to other. The order of the EST execution can be according to the same order that they receive the input test data in the TDN.

The process wrapper can be integrated into the TDE. The TDE can generate start signal for the core based on the Begin received from the test sequencer or the ¬Begin programmed in the TDE. Similarly, the TDE can provide the End to the test sequencer based on the done signal from the core or the timeout from the timer.

Figure 25:
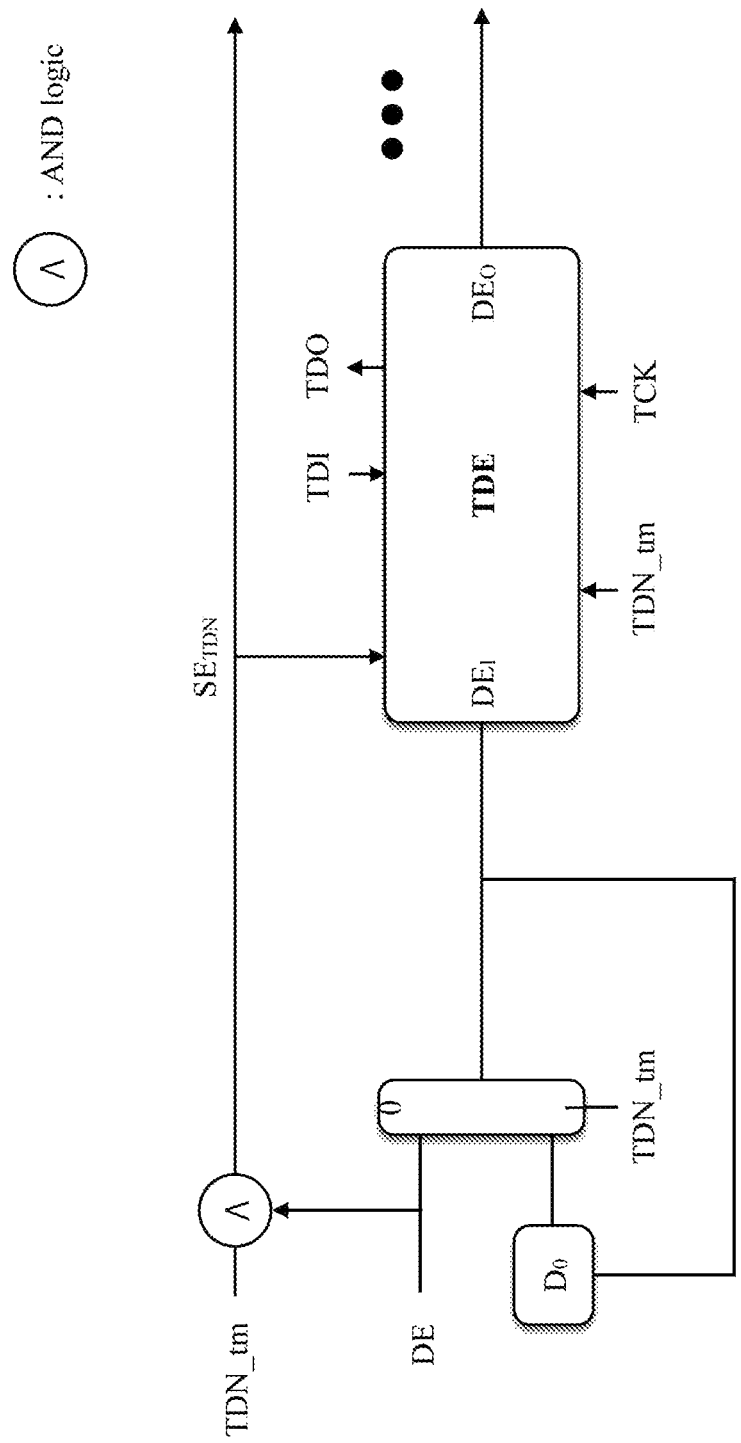
FIG. 25 is an embodiment of test hardware for TDN test.

The TDN can also be structurally tested before the testing of the system. When the TDN_tm=1, as shown in FIG. 25, the DE can function as a scan enable for the testing of the TDN, denoted as $SE_{TDN}$. The $SE_{TDN}=1$ during the test delivery. The input to the DE can be provided from the storage cell $D_0$ through the multiplexor. The output of the multiplexor can be observed at the same storage cell after capture. The TCK can be provided as a test clock to all registers including the storage cells. The test setup which initializes internal control registers for test execution can concur with the last scan shift to observe the final test response of the TDN.

The TDN test mode can be utilized for intermediate programming of the test control registers and the storage cells in the TDN. Since the TDN_tm can disable the scan clocks SCK and $SCK_{TL}$, the structural test of system under test can be paused and resumed after programming.

After the TDN test, the test control registers can be programmed and structural testing of system, denoted as SYS_TEST, can be initiated. The system test procedure can be summarized as SYS_TEST=Test setup→(Test delivery→Sequential test setup→Test execution)* where * denotes any required number of repetitions. In the beginning of the test, test control registers can be programmed prior to delivery of test data. There can be two types of test control registers in the TDN; non-volatile and volatile. The non-volatile control registers can be programmed in the setup and their contents can remain unchanged throughout the test. Example of the non-volatile control register can be the test configuration register. Content of the volatile control registers can be changed during test delivery and execution. They can be reset before the test delivery. Test delivery can be initiated after the test setup and prior to test execution. The sequential test using external clock or the sequential test setup can be introduced between test delivery and test execution. The sequential test setup can forward system states using an external clock until the required state can be reached for at-speed test execution. At the end of test execution, the volatile registers can be reset so that the next test delivery can be resumed.

Test delivery of the TDN can be summarized as transmission of the tagged test patterns at its input according to the test distribution protocol and observation of the test responses at its output for test decision. Each test pattern can consist of test data packets followed by the end of test data (EOTD) that specifies the test pattern boundary. The EOTD is not necessarily a test data packet. It can be a sequence of signal transitions of the DE embedded in the test protocol or control sequence. The EOTD, for example, can be a rising transition followed by a falling. The test pattern structures of the FD and the GD are shown in the table below. Each test packet is denoted as the tdPkt in Table 6.

TABLE 6

| FD | $tdPkt_0$ | $tdPkt_1$ | $tdPkt_2$ | ... | $tdPkt_{L-1}$ | $EOTD^N$ |
|---|---|---|---|---|---|---|
| GD | $(tdPkt_0; EOTD)$ | $(tdPkt_1, EOTD)$ | | ... | $(tdPkt_{N-1}; EOTD)$ | |

For the FD, the test pattern can consist of the L number of test packets appended by the N number of the EOTDs. The L and N denote the maximum scan chain length of the cores and a number of the enabled TDEs, respectively. The N number of EOTDs is to acknowledge the end of test delivery to all N number of TDEs. All test packets can carry the N number of test data. The $tdPkt_j$ contains the test data to be shifted into the scan chains of all enabled cores during j-th scan shift. In the GD, however, there are N number of test packets and each test packet is followed by the EOTD. Each test packet contains test data for entire scan chains in each core. Size of each test packet can depend on the maximum scan chain length of each core and can be different from test packet to test packet. Based on the distribution method chosen, the TDE can extract the required test data from each test packets and load them to the scan chains that it is servicing. Upon detection of the EOTD, the TDE can refrain from test data delivery and wait for test execution or engage in the sequential test setup if specified.

The test data packet can comprise collection of the test data paired with the DE value to indicate a valid input test data. The k-th test data and its DE value are denoted as $td_k$ and $de_k$, respectively. The k=N for the FD and $k=L_j$ for the j-th core in the GD for all j. The test packet can be prefixed with a filler data and its DE value which is zero. The test packet boundary can be marked with a pair (0, filler).

| tdPkt | (0, filler) | $(de_0, td_0)$ | $(de_1, td_1)$ | ... | $(de_{k-1}, td_{k-1})$ |
|---|---|---|---|---|---|

Each test data in the test packet should be consumed only once by the designated TDE for scan load/unload of the corresponding core. Amount of the test data to be consumed by each TDE can be specified in the test packet of the chosen distribution method. The test packet of the FD contains the N number of test data which can be equally distributed to the same number of the TDEs. Thus, each test data can be consumed by each core. The test packet of the GD, however, can contain the test data to load entire scan chains of the corresponding core. After consumption of the test data in the test packet, the TDE can refrain from consuming extra test data and it waits for the test execution.

To synchronize the test data consumption or to ensure the test data to be consumed as intended, a test data consumption indicator, denoted as TDC, for each TDE can be derived from a stream of the DE values. The TDC for the FD and the GD can be different due to a different test data distribution criteria. The TDC, for example, can be every rising transition of the DE for the FD whereas it can be the DE values between a rising and falling transitions of DE for the GD. The TDC can indicate that the test data is ready to be consumed by the corresponding core. The TDE that can detect the TDC can consume the test data. When the TDC is detected at the TDE, the test data can be loaded into the scan chains from the TDI and unload the scan output to the TDO with the $DE_O=0$. A number of valid test data in the test packet, or size of the test packet, can decrease as the input test data is consumed. The consumed input is replaced by the test result output. The TDC can automatically aligned to the next available test data by the $DE_O$ reset. After the final TDE, all of the valid test data can be consumed and the test packet size can be zero.

Test delivery can be performed according to the test data distribution protocol. The test data distribution in each TDE can be summarized as if $(BP \lor \neg TDC \lor EOTD)$ then $(TDO <= TDI \| DE_O <= DE_I)$;
if $(\neg BP \land TDC \land \neg EOTD)$ then $(SI <= TDI \| TDO <= SO \| DE_O <= 0)$;

where the symbols $<=$ and $\|$ denote a synchronous assignment and a parallel execution, respectively. The assignment is synchronized to the clock under consideration in the synchronous assignment. In the parallel operation $A\|B$, execution of the A and the B can be considered simultaneous within the clock period so that any out-of-order test execution of them can produce the same result. If the BP=1, the test data can be simply bypassed from the TDI to TDO without alteration. Otherwise, the TDE can consume the test data when the TDC=1. When the scan load and unload are completed, the $DE_O$ can be reset to align the TDC to the next available test data.

Figure 26:
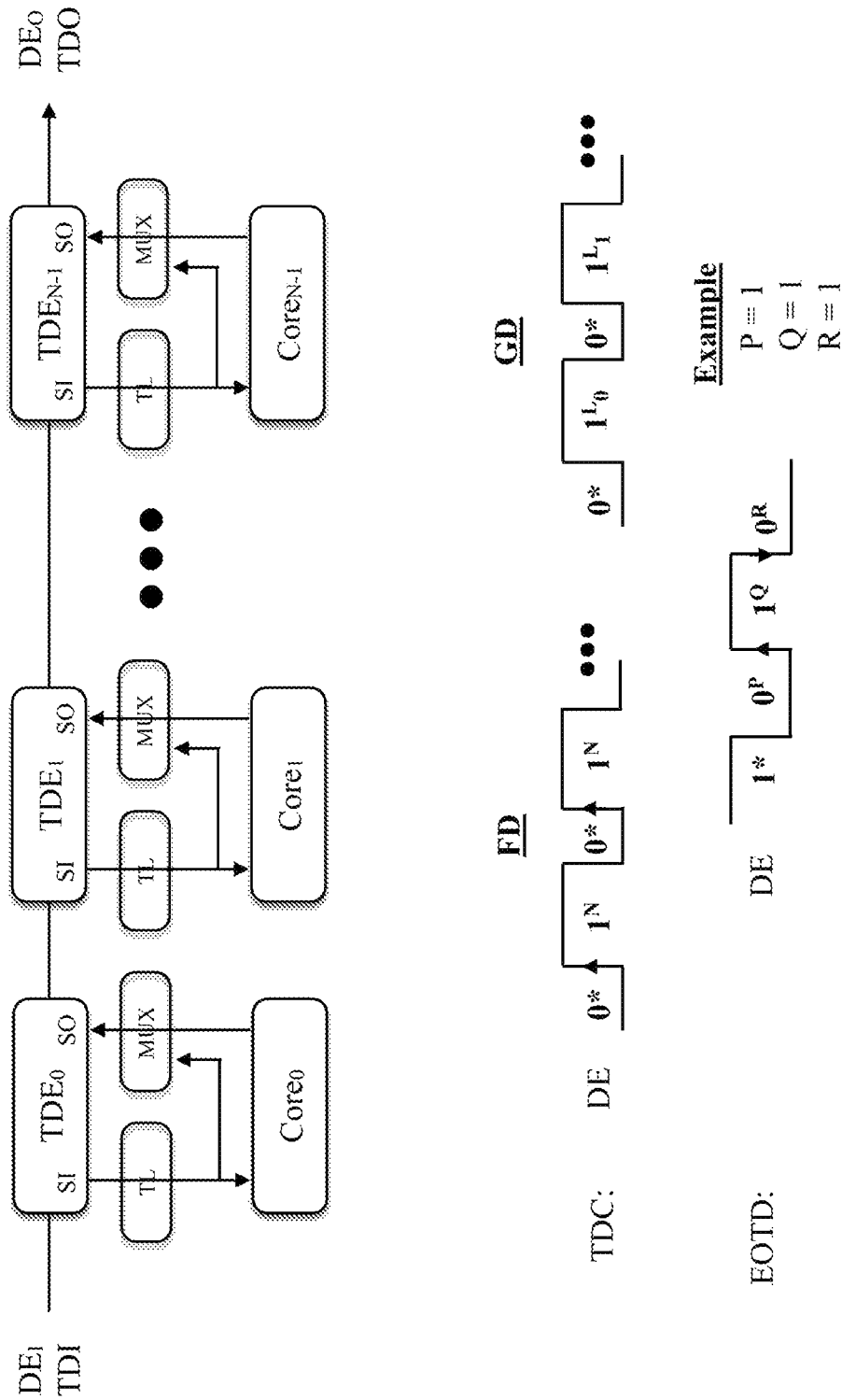
FIG. 26 is an embodiment of Encoding of Update and EOTD in dedicated scan IO.
Figure 27:
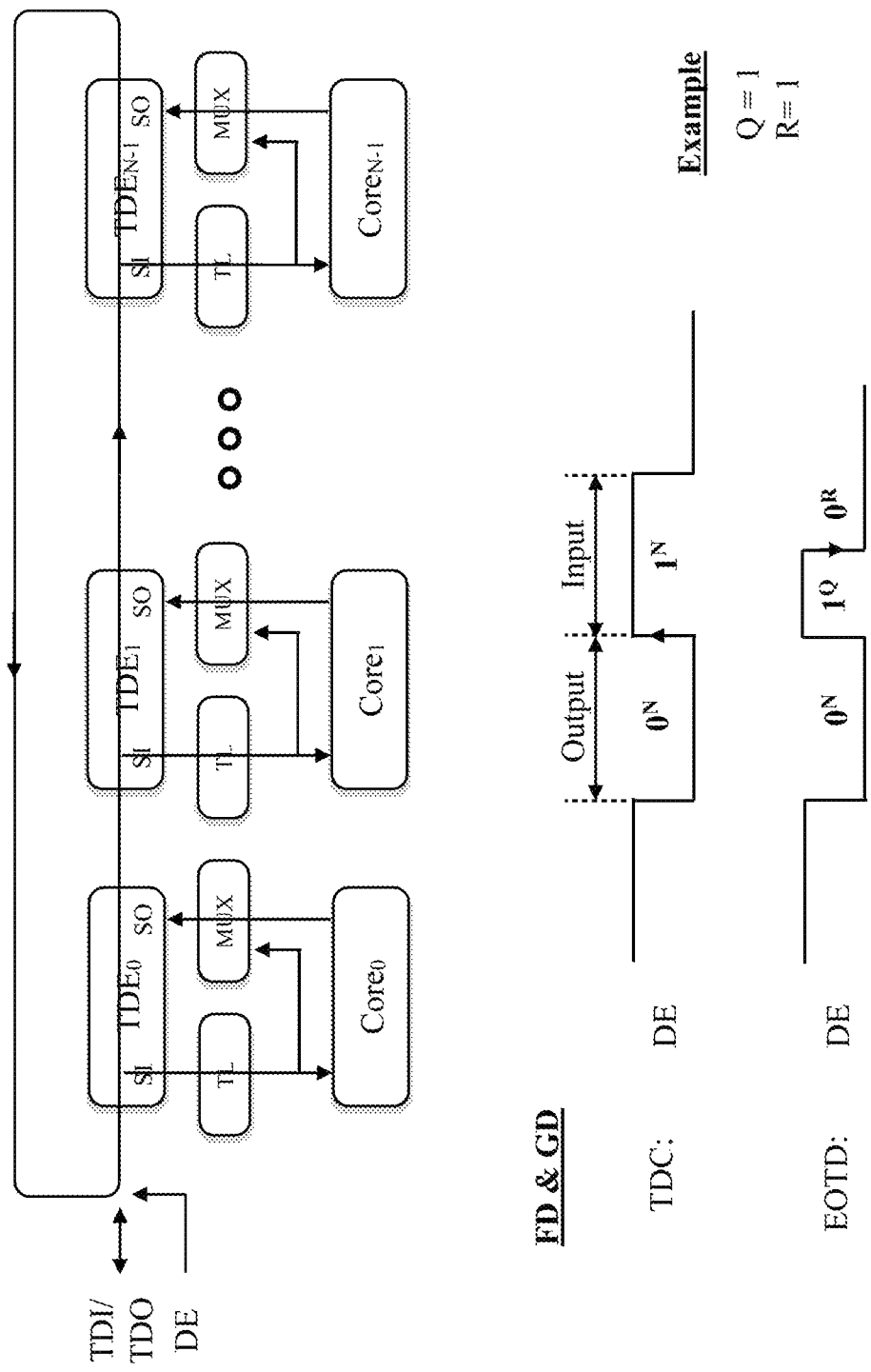
FIG. 27 is an embodiment of Encoding of Update and EOTD in half-duplex scan IO.

Encoding schemes of the TDC and the EOTD for the dedicated scan IO and the half-duplex are shown in FIG. 26 and FIG. 27, respectively. In the figures, the N and $L_j$ denote the number of enabled TDEs and the maximum scan chain length of the j-th core, respectively. As discussed earlier, the TDC can be asserted between the rising and falling transitions of the DE for the GD and at every rising transition of the DE for the FD. The EOTD can be encoded as a rising transition followed by a falling transition of the DE or a sequence of 010. Encoding of the EOTD can be the same for all distribution methods and scan IO configurations. The rising transition and the logic 1 in the EODT sequence can be utilized for the last data in the test delivery for the FD and the GD, respectively. The EOTD can be provided to each of the enabled TDE at the end of each test pattern.

In the half-duplex scan IO configuration shown in FIG. 26, the DE signal can function as a control signal for IO multiplexing. If the DE=1, for example, the IO can be configured as a primary input (PI) and otherwise, a primary output (PO). The period of IO multiplexing can be defined as 2N, where the N can be the total number of TDEs in the TDN. The half-duplex IO multiplexing can constrain the number of input test data to be sent within the period of IO multiplexing. Test throughput can be defined by a number of scan inputs that can be delivered to the core in the period of IO multiplexing. Maximum test throughput can be a half of the IO multiplexing period which is N. The maximum can be reached when a number of enabled TDEs can divides the N. For example, if the N=10 and the number of enabled TDEs can be 2 and 3, the maximum number of input test data can be 10 and 9, respectively. The corresponding DE sequences can be (0011001100→100100011)* and (0001110000→1110001110)*, respectively. For the purpose of discussion, all of the TDEs are assumed to be enabled for test in the half-duplex scan IO configuration. The half-duplex scan IO can also incorporate MISR to compact scan outputs in order to increase the test throughput up to 2N for test cost advantage. The MISR based test method is discussed later.

The test sequencer enable (TSE) can be encoded as the logic 0 of the DE preceded by the EOTD. If the DE=0 after the EOTD is detected in the TDE, the corresponding TDE asserts the TSE to enable the test execution. The core test can be initiated according to the test sequence specification.

The sequential test using external clock (EST), if the EST=1, can be initiated after test data delivery and prior to test execution. Beginning of the EST can be encoded as two consecutive logic 1s of the DE preceded by the EOTD. The EOTD can be delivered to the all TDEs before the sequential test. If the begin condition of the EST is detected in the TDE, the sequential test can be performed until the end of sequential test (EOEST) sequence is received from tester. The sequence of the EOEST can be the same as that of the EOTD. Upon detection of the EOEST sequence, the TDE can generate the EOEST to enable the EST of the next core. The control sequence of the EST can be the same as the GD. The sequential test can be performed when the DE=1 and terminated when the rising transition of the DE is followed by the falling transition.

Figure 28:
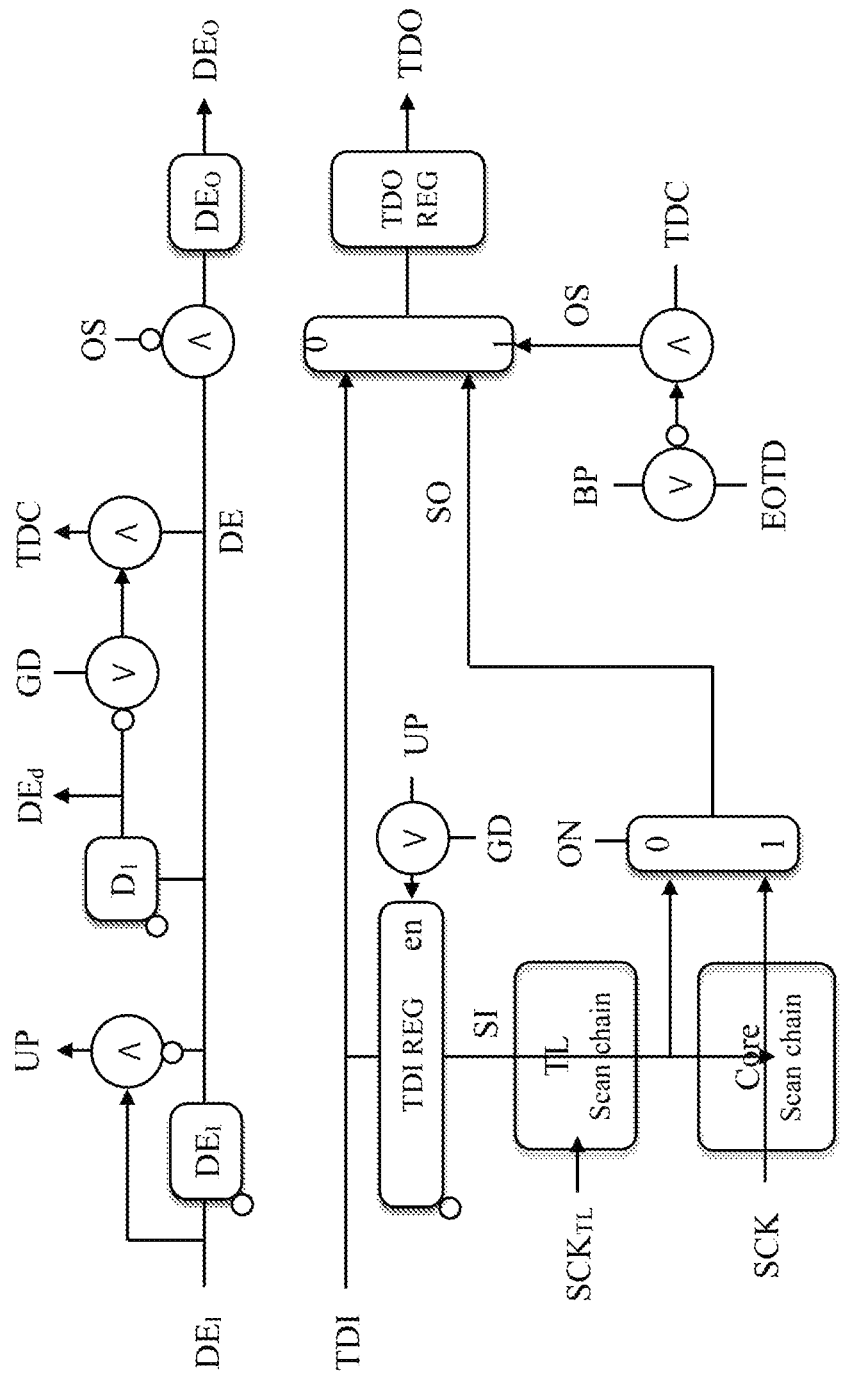
FIG. 28 is a Structure of test distribution element (TDE).

The structure of the TDE is presented in FIG. 28 and FIG. 29A-C. Each test data can be tagged with the DE to indicate valid input test data. Incoming test data can be captured into the TDO register. Similarly, the corresponding DE can be pipelined into the $DE_I$ and the $DE_O$. The valid test data can be loaded into the TDI register if a rising transition of the DE can be detected at input and output of the $DE_I$ storage cell and indicated by UP signal. The TDI register can serve as a lock-up register for timing closure and provide a high-to-low speed test interface in the FD. Once the test data is loaded into the TDI register, it can remain unchanged until the next available test data is detected. Scan load/unload can occur between two available test data detections. The $DE_I$ and the TDI register can store input data at a falling edge of the TCK. Similarly, the $DE_O$ and the TDO register can store output data at a rising edge. The falling edge triggered storage cell and register are denoted as a bubble at the lower left corner of the storage cell or register. If the BP=1, as shown in FIG. 28, the tagged test data can be bypassed from the TDI register to the TDO without alteration. Otherwise, test data captured into the TDI can be loaded into the scan chains through the scan-in (SI) and test response can be unloaded to the TDO register through scan-out (SO). When the scan output is unloaded, the $DE_O$ can be reset (to logic 0) so that the test response will not be reused by any other TDEs. The SO can be provided from the TL scan chains or the core, depending on ON signal. If a core test were turned off, or the ON=0, the SCK can be shut off and only the scan clock $SCK_{TL}$ can be enabled to provide the SO to the TDO register. Otherwise, all scan clocks are enabled and the SO can be provided by core scan chains. When the BP=1, the ON can also be used to control the peak power during test delivery. By turning on set of any bypassed cores, the peak power can be worsened during test delivery.

The scan clocks can be enabled when test data is available. Availability of test data during test delivery can be indicted by the TDC. The TDC detection circuitry shown in FIG. 28. The rising transition of the DE for the FD can be detected by the current value of DE and the delayed one, as denoted as $DE_d$. The TDCs can cause scan load/unload during test delivery. The scan clocks can be enabled and the output select (OS) can be asserted for the scan output. The OS can be determined as $$OS = TDC \land (\neg BP \lor EOTD) \qquad \text{Eq. 24}$$

Figure 29A:
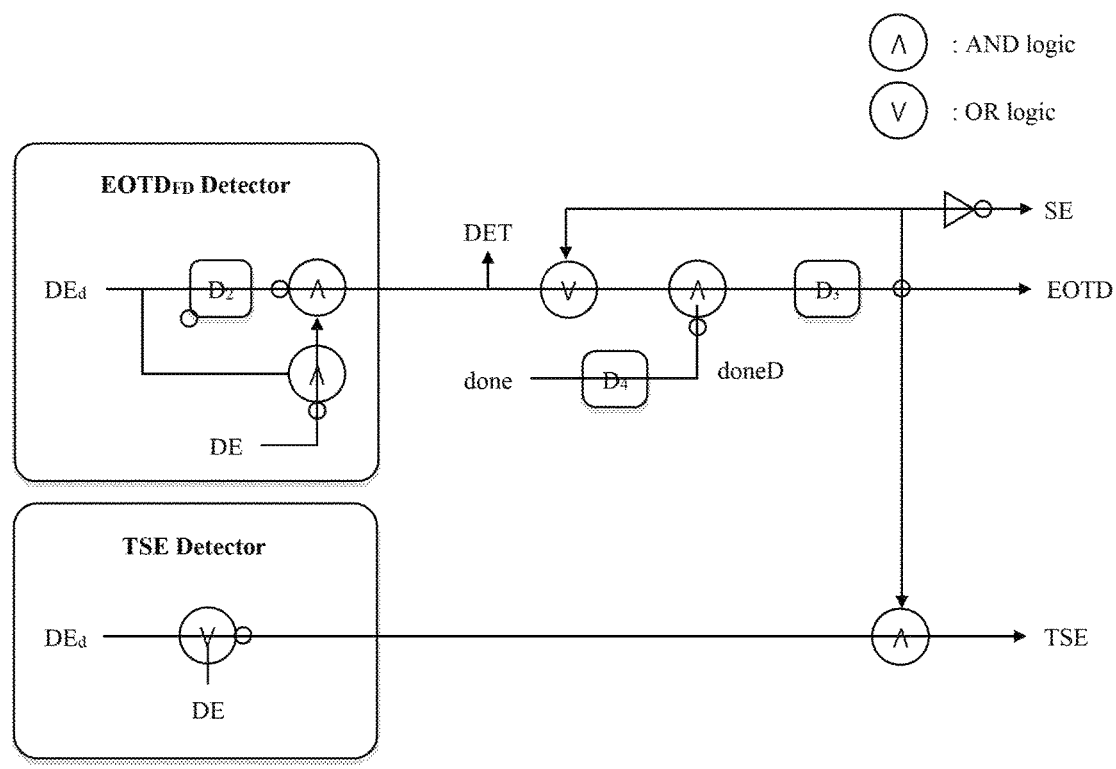
FIG. 29A is an embodiment of the SE, the EOTD and the TSE generator.

The EOTD and the TSE generator, as shown in FIG. 29A, can detect the EOTD and TSE enabling conditions. When they are detected, the EOTD generator can lock the detection, denoted as DET, and stay asserted until the end of test execution or the doneD=1. The local SE can be provided from logical negation of the EOTD, or the SE=¬EOTD. After the test delivery or when the EOTD=1, the DE can be used for other purposes such as detection of the TSE and the EST. All of the storage cells $D_2$ to $D_4$ are volatile storage cells. They can be reset at the end of test execution indicated by the doneD=1. The doneD signal is the done signal delayed by one TCK clock cycle. The inserted delay in the done signal can allow the output of the TL to be captured into the translation vector register (TVR), as discussed in FIGS. 3A and 3B, before completion of the test execution indicated by the End=1.

The TSE can be asserted when the EOTD=1 and the DE=0. When the TSE=1, the TDE can be enabled for the test execution. The TSE can function as a gating signal for the start signal that can trigger test execution of core. If asserted, the start signal can be caused by its inputs; Begin and ¬Begin.

Figure 29B:
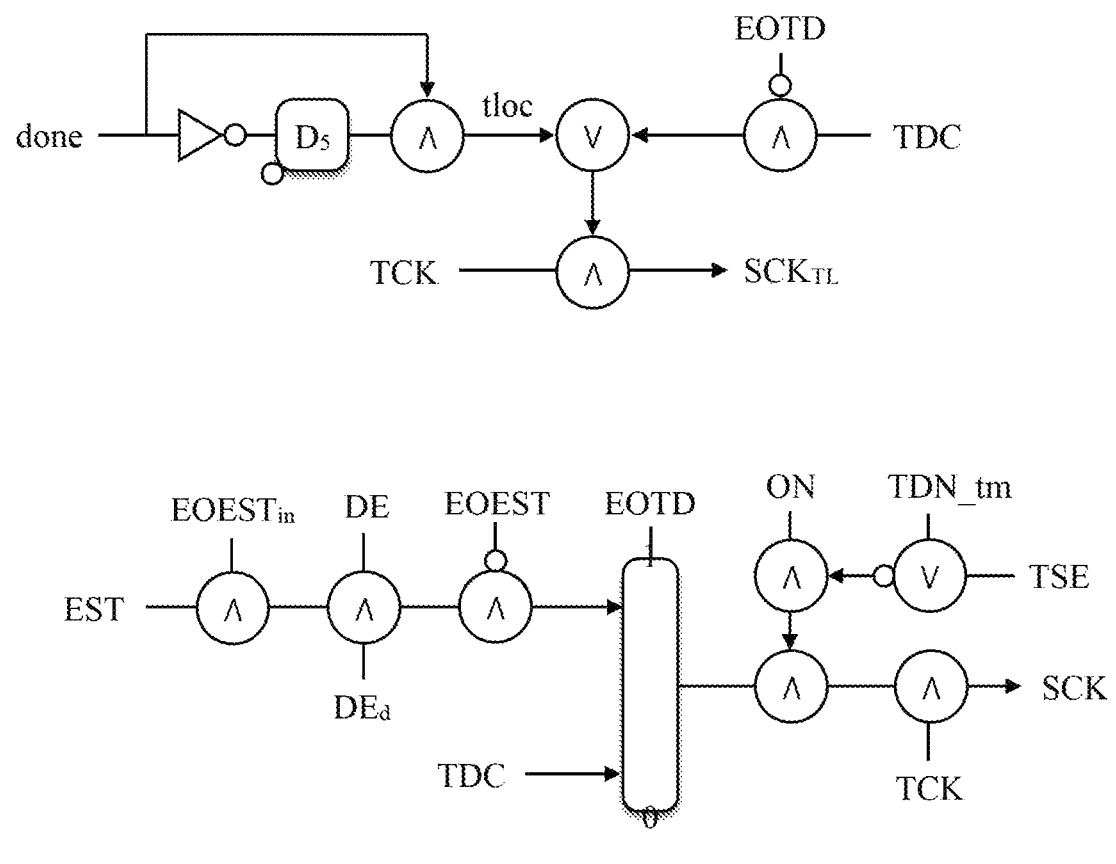
FIG. 29B illustrates local scan clocks for TL and core.
Figure 29C:
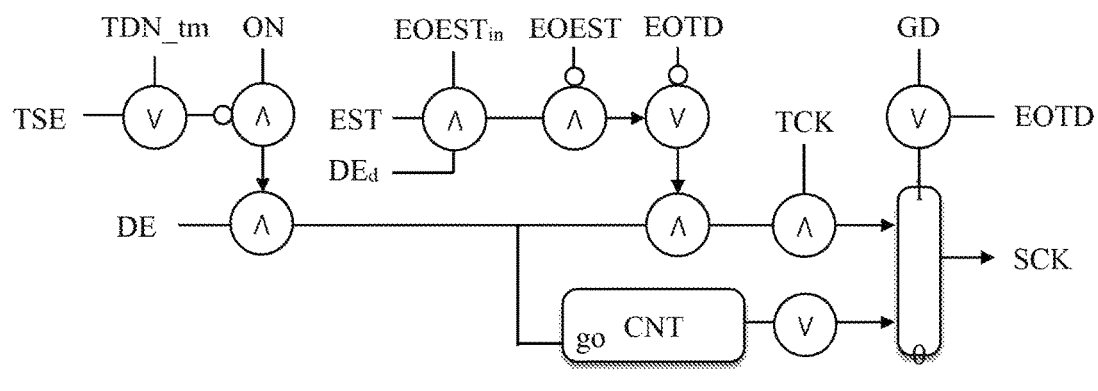
FIG. 29C illustrates the derived local scan clock for core.
Figure 29C:
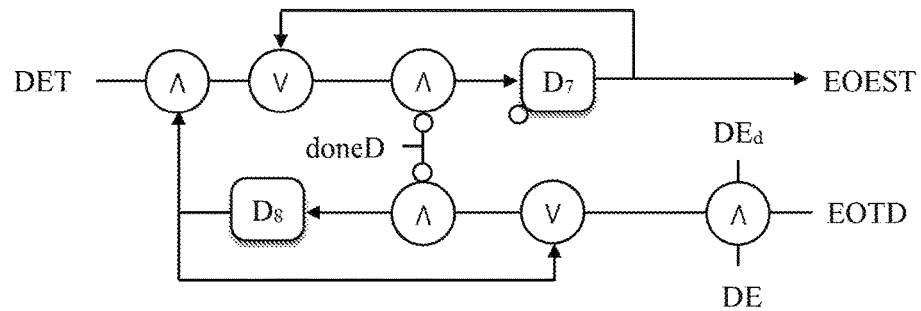

The scan clock generators are shown in FIG. 29C. The local scan clocks for the TL and the core, denoted as the $SCK_{TL}$ and the SCK, can be derived from the TCK and the DE. Both scan clocks can be active during the test delivery. They can be shut off at the end of the test delivery and during the TDN test, when the TDN_tm=1. The SCK can be directly generated from the DE for the FD. Unlike the SCK, the $SCK_{TL}$ can be active to capture output of the source, when the sink is disabled for the test.

The SCK L can be enabled to capture output of the TL after the done and before the End. The TL output capture signal, denoted as a tloc, can be reset if the done=0 and otherwise, set to logic 1 for a TCK clock period. The negative edge storage cell can store ¬done and enable one TCK clock pulse at a rising transition of the done signal. Employment of the negative-edge clocked storage cell can aid to preserve a duty cycle of the clock.

The SCK for the core scan chains can be derived from the TCK or DE. As shown in FIG. 29B, the SCK can be provided from the TCK based on the condition specified by the clock gating logic. The SCK can be disabled if the ON=0, the TDN_tm=1 or the TSE=1. Otherwise, usage of the SCK can be determined by the EOTD. During test delivery, or the EOTD=0, the SCK can provide a scan clock to the core under test. The TDC can provide a clock enable control signal for the TCK. If the TDC=1, the SCK=TCK and otherwise the SCK=0. After test delivery, or the EOTD=1, the SCK can provide the test clock for the EST. The EST can be performed one core at a time. Order of the EST execution in the TDN can be the order that the cores receive the test inputs in the TDN. The EST test can be initiated after the previously scheduled EST test is completed. After completion of the test, the EOEST can be asserted. The EST test can be enabled if the following conditions are satisfied 1. TDN_tm=0, ON=1 and TSE=0
2. $EOEST_{in}=1$
3. Detection of beginning of EST indicated by $(DE \land \neg DE_d \land \neg EOTD)=1$
4. EOEST=0

Note that the BP does not affect the scheduled EST. The EST test in the bypassed TDE can be controlled to affect power during the EST test of other cores.

For the FD, duty cycle of the SCK discussed in FIG. 29B can be unbalanced. Since there can a single TCK clock pulse in each test data packet of size N, there can be logic 1 state for one TCK clock period followed by logic 0 state for N−1 clock periods. If the TCK clock were high-speed clock, it can impose unnecessary timing constraints to scan shift circuitry including the SCK. The duty cycle can be improved by employment of modulo counter (CNT) as shown in FIG. 29C. The CNT can be reset to zero initially. In the FD, the CNT can check the go signal only in the reset state. If it is asserted, the CNT can produce count sequence of $0 \rightarrow 1 \rightarrow 2 \rightarrow \ldots \rightarrow \lceil N/2 \rceil - 1 \rightarrow \lceil N/2 \rceil \rightarrow 0 \rightarrow \ldots \rightarrow 0$ before the go signal can be checked again, where $\lceil x \rceil$ denotes a ceiling function which rounds up to the smallest integer greater than x. If the go=0 during the reset state, the CNT can wait until the go=1. The clock can be obtained by applying OR operation to output of the CNT. If, for example, N=6, then the CNT output can be $0 \rightarrow 1 \rightarrow 2 \rightarrow 3 \rightarrow 0 \rightarrow 0$ and the ORed output can be $0 \rightarrow 1 \rightarrow 1 \rightarrow 1 \rightarrow 0 \rightarrow 0$. Since the number of ones and zeros in the SCK are the same, the duty cycle can be balanced.

Figure 30:
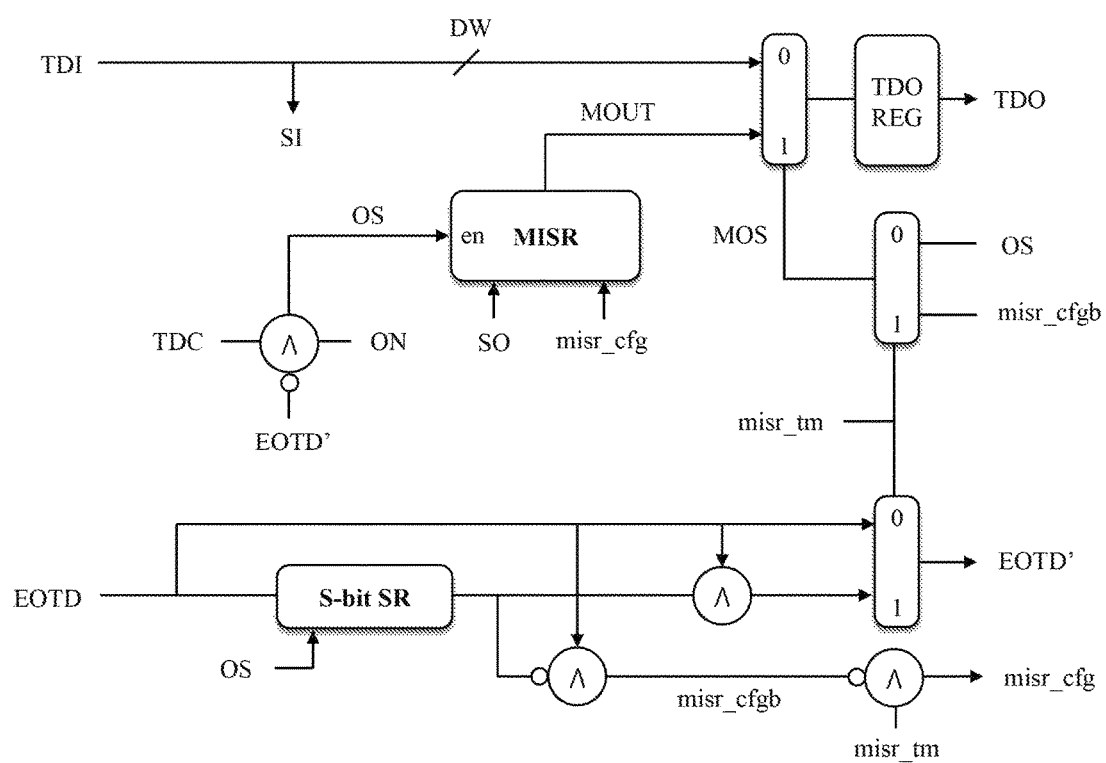
FIG. 30 illustrates a test distribution element incorporating Multiple Input Signature Register.

A multiple input signature register (MISR) can be incorporated into the TDE, as shown in FIG. 30. MISR can compact the scan chain outputs or the SO to reduce test data volume. MISR is a linear feedback shift register (LFSR) with multiple inputs. A size of MISR can be determined by the number of storage cells in the LFSR and can be S×DW, where the S≥1. MISR can compacts content of the scan chains and produce the final signature for test decision. Hence, MISR can significantly reduce the test data volume that needs to be processed externally.

MISR based test can be beneficial, especially in the half-duplex scan chain configuration. The TDN can engage in input for duration of entire test pattern followed by output for the signature at the end of test delivery.

MISR can be configured by the misr_cfg control signal. If the mist_cfg=1, MISR can be enabled with the predefined polynomial. Otherwise, MISR can be disabled and behave as a S-stage shift register. Alternatively, MISR can be simply bypassed. The scheme is described with the S-stage shift register. Since function of MISR is to compact the scan chain outputs, it can be enabled by the OS. If the OS=1, MISR can advance its state. Otherwise, it can maintain its current state.

Incorporation of MISR into the test can be determined by the MISR test mode denoted as the misr_tm. If the misr_tm=0, the TDE behaves as the one discussed in FIG. 28. MISR can be configured into a shift register and the scan chain length can be increased by S. Otherwise, the scan output (SO) can be compacted by MISR without being transferred to the TDO register. During compaction, however, the test data delivered to the TDI can also be bypassed to the TDO register. When the test data is compacted, the OS=1 and the $DE_O=0$ so that the bypassed test data is not consumed by any other TDEs. Note that DE and TDC are not explicitly shown in FIG. 30 but they are assumed to be the same as one in FIG. 28. At the end of each test delivery, MISR signature can be observed at the output of the TDN for test decision.

When the misr_tm=1, MISR output select (MOS) can be determined by misr_cfgb which is complement of misr_cfg. When misr_cfg=0, or equivalently misr_cfgb=1, MISR can function as a shift register and shift out the signature according to the TDN test protocol. Each test pattern can be prefixed with the initialization vectors for MISR. In order to shift out MISR signature, the MOS must be asserted for S number of scan output data. The requirement of the MOS can be achieved by the test controller shown in FIG. 30. The test controller can provide misr_cfg and the EOTD' which is the EOTD delayed by the S number of test data. The S-bit shift register can be enabled if the OS=1. Otherwise, the shift register remains in the current state. The S-bit shift register can be filled with logic 1 during the test delivery. The number of ones stored in the shift register can delay the EOTD by the S number of scan shifts and allow loading/ unloading of MISR signature. After loading/unloading of MISR signature, the misr_cfgb=0 and MISR can be enabled again to compact the SO. This process can be repeated until all test patterns are tested.

Computational aspect of MISR signature can conform the compositional ATPC (automatic test pattern composition) approach taken by the scheme. MISR signature can be determined from the polynomial employed in MISR and the test pattern applied to the core under test including the TL. Calculation of MISR signature does not require design netlist. MISR signature can be calculated from the scan outputs of test patterns. Compaction of scan outputs using MISR can significantly simplify the IO multiplexing in the half-duplex scan IO configuration. Application of MISR to the half-duplex scan IO configuration can allow efficient integration of various advanced DFT techniques to reduce test cost measured by test time and test data volume.

The novel compositional ATPG and accompanying DFT method are presented. The scheme can shorten time-to-market window, reduce test and test development costs and increase engineering efficiency. The scheme can reuse sb-chip or core level test patterns for the ATPG of system level test patterns without requiring the system design netlist and, hence, can be suitable for test development of large systems. The accompanying DFT method provides a modular test platform that can achieve 100% test pattern utilization, provide a plug-in interface for unified test integration of IP cores and enable efficient management of power and test resource by localizing test operations within each sub-design or the IP cores. If the scheme can be applied to test applications, it can provide time-to-market advantage and test cost savings.

I claim:

1. A method of testing integrated circuits with the aid of a computer comprising the steps of:
within the computer, for each integrated circuit,
receiving cores and test environments representing the integrated circuit, the test environment including a test sequence and corresponding topology;
generating test patterns of all cores and their test environments in parallel;
for the given test sequence and topology, computing the translation vectors for all sinks specified in the topology, wherein the topology provides channel connectivity information to identify the source and sink for a test;
combining the core test patterns with the translation vectors to obtain test patterns of the target system;
testing the integrated circuit by applying the test patterns of the target system; and
generating from the test results a final design of the integrated circuit.

2. A method, as in claim 1, combining the core test patterns including calculating translation vectors based on a given set of core test patterns, test sequence and a labelled topology.

3. A method, as in claim 1, generating test patterns including uniquely identifying each test pattern by a test pattern number.

4. A method, as in claim 3, further comprising representing the cores and test environments by their corresponding test patterns.

5. A method, as in claim 4, wherein a given set of test patterns specifies the core and the test environment in context of the test.

6. A method, as in claim 4, including encapsulating each core with its test environment for test pattern generation.

7. A method, as in claim 1, generating test patterns including obtaining for each core, a set of independently generated test patterns, test patterns corresponding to the primary inputs, and test patterns corresponding to the primary outputs.

8. A method, as in claim 1, computing the translation vectors including:
computing output channel environment $ITE_{x,y}$;
computing input channel environment $OTE_{y,z}$;
transmitting the input channel environment $OTE_{y,z}$ to the sink z and receiving input channel environment $OTE_{x,y}$ from the source x;
equalizing test pattern count of the input and output channel environments $OTE_{x,y}$ and $ITE_{x,y}$;
computing translation vectors $TV_{x,y}$ from the input and and output channel environments $OTE_{x,y}$ and $ITE_{x,y}$ based on a given test sequence TS; and
constructing system test patterns SYS_TP.

9. A method, as in claim 8, equalizing test pattern count of the input and output channel environments including obtaining tp_count($OTE_{x,y}$)=tp_count($ITE_{x,y}$).

10. A method, as in claim 8, computing translation vectors including determining test vectors from a given test sequence determine $TV_{x,y}[y.i] \in PRE\_TV_{x,y}$ or $POST\_TV_{x,y}$ from a given TS.

11. A method, as in claim 8, constructing SYS_TP including by composing $CORE\_TP_x$, $CORE\_TP_y$ and $TV_{x,y}$.

12. A method, as in claim 1, combining the core test patterns including generating a test sequence that allows continued test execution of multiple cores simultaneously.

* * * * *